US010872784B2

(12) United States Patent
Kim et al.

(10) Patent No.: US 10,872,784 B2
(45) Date of Patent: Dec. 22, 2020

(54) ETCHING GAS MIXTURE, METHOD OF FORMING PATTERN BY USING THE SAME, AND METHOD OF MANUFACTURING INTEGRATED CIRCUIT DEVICE BY USING THE ETCHING GAS MIXTURE

(71) Applicant: SAMSUNG ELECTRONICS CO., LTD., Suwon-si (KR)

(72) Inventors: Do-hoon Kim, Hwaseong-si (KR); Tae-hyung Kim, Seoul (KR); Jong-min Baek, Incheon (KR); Han-dock Song, Cheongju-si (KR)

(73) Assignees: SAMSUNG ELECTRONICS CO., LTD., Suwon-si (KR); Wonik Materials, Cheongju-si (KR)

( * ) Notice: Subject to any disclaimer, the term of this patent is extended or adjusted under 35 U.S.C. 154(b) by 0 days.

(21) Appl. No.: 16/143,614

(22) Filed: Sep. 27, 2018

(65) Prior Publication Data
US 2019/0148167 A1 May 16, 2019

(30) Foreign Application Priority Data
Nov. 16, 2017 (KR) .................. 10-2017-0153318

(51) Int. Cl.
C09K 13/00 (2006.01)
H01L 21/3213 (2006.01)
H01L 21/3065 (2006.01)
H01L 21/311 (2006.01)
H01L 27/108 (2006.01)

(52) U.S. Cl.
CPC ........ H01L 21/32139 (2013.01); C09K 13/00 (2013.01); H01L 21/3065 (2013.01); H01L 21/31116 (2013.01); H01L 21/32137 (2013.01); H01L 27/10885 (2013.01)

(58) Field of Classification Search
CPC ... C09K 13/00; C09K 13/08; H01L 21/32139; H01L 21/3213; H01L 21/32136
USPC .......................................................... 252/79
See application file for complete search history.

(56) References Cited

U.S. PATENT DOCUMENTS

| 5,368,686 | A | 11/1994 | Tatsumi et al. |
| 6,020,270 | A | 2/2000 | Wong et al. |
| 7,645,707 | B2 | 1/2010 | Rusu et al. |
| 7,744,769 | B2 | 6/2010 | Mouri et al. |
| 7,919,141 | B2 | 4/2011 | Tanioka et al. |
| 8,323,516 | B2 | 12/2012 | Bita et al. |
| 8,372,756 | B2 | 2/2013 | Mitchell et al. |
| 8,557,706 | B2 | 10/2013 | Honda et al. |
| 9,017,571 | B2 * | 4/2015 | Umezaki ........... H01L 21/31116 216/58 |
| 9,548,217 | B2 * | 1/2017 | Muro ................. H01L 21/32134 |
| 9,772,555 | B2 * | 9/2017 | Park ..................... H01L 21/0338 |
| 9,837,285 | B2 | 12/2017 | Tomura et al. |

(Continued)

FOREIGN PATENT DOCUMENTS

| JP | 08-291299 A | 11/1996 |
| JP | 10-081600 A | 3/1998 |

(Continued)

Primary Examiner — Jane L Stanley
(74) Attorney, Agent, or Firm — Lee IP Law, P.C.

(57) ABSTRACT

An etching gas mixture, a method of forming a pattern using the etching gas mixture, and a method of manufacturing an integrated circuit device using the etching gas mixture, the etching gas mixture including a C1-C3 perfluorinated alkyl hypofluorite; and a C1-C10 organosulfur compound that includes a C—S bond in the compound.

17 Claims, 26 Drawing Sheets

(56) References Cited

U.S. PATENT DOCUMENTS

| | | | |
|---|---|---|---|
| 2004/0157448 A1* | 8/2004 | Yates | H01L 21/02063 438/689 |
| 2007/0006893 A1 | 1/2007 | Ji | |
| 2007/0029281 A1* | 2/2007 | Mouri | C03C 15/00 216/58 |
| 2007/0257261 A1* | 11/2007 | Hirai | G02F 1/1303 257/59 |
| 2015/0225645 A1* | 8/2015 | Kamimura | H01L 21/30608 438/754 |
| 2015/0243527 A1* | 8/2015 | Muro | C09K 13/08 438/754 |
| 2015/0247087 A1* | 9/2015 | Kamimura | H01L 21/32134 438/754 |
| 2015/0255309 A1* | 9/2015 | Nishiwaki | H01L 21/32134 438/754 |
| 2017/0103901 A1* | 4/2017 | Shen | C09K 13/00 |
| 2019/0016906 A1* | 1/2019 | Seol | G03F 7/322 |
| 2019/0189782 A1* | 6/2019 | Greene | H01L 27/0886 |

FOREIGN PATENT DOCUMENTS

| | | | | |
|---|---|---|---|---|
| JP | 2000-038581 A | 2/2000 | | |
| JP | 2000-265275 A | 9/2000 | | |
| JP | 2001-153996 A | 6/2001 | | |
| JP | 2002-184765 A | 6/2002 | | |
| JP | 2003-297757 A | 10/2003 | | |
| JP | 2005-076088 A | 3/2005 | | |
| JP | 2010-229429 A | * 10/2010 | | C23F 1/44 |
| JP | 2012-026020 A | 2/2012 | | |
| JP | 2012-174922 A | 9/2012 | | |
| KR | 10-2004-0026639 A | 3/2004 | | |
| KR | 10-2005-0050569 A | 5/2005 | | |
| KR | 10-2006-0046588 A | 5/2006 | | |
| KR | 10-2006-0046589 A | 5/2006 | | |
| KR | 10-2006-0132945 A | 12/2006 | | |
| KR | 10-1049309 B1 | 7/2011 | | |
| KR | 10-2013-0036320 A | 4/2013 | | |
| KR | 10-2016-0028370 A | 3/2016 | | |
| WO | WO 2012/114611 A1 | * 8/2012 | | H01L 21/3065 |

* cited by examiner

B - B'

ETCHING GAS MIXTURE, METHOD OF FORMING PATTERN BY USING THE SAME, AND METHOD OF MANUFACTURING INTEGRATED CIRCUIT DEVICE BY USING THE ETCHING GAS MIXTURE

CROSS-REFERENCE TO RELATED APPLICATION

Korean Patent Application No. 10-2017-0153318, filed on Nov. 16, 2017, in the Korean Intellectual Property Office, and entitled: "Etching Gas Mixture, Method of Forming Pattern by Using the Same, and Method of Manufacturing Integrated Circuit Device by Using the Etching Gas Mixture," is incorporated by reference herein in its entirety.

BACKGROUND

1. Field

Embodiments relate to an etching gas mixture, a method of forming a pattern by using the etching gas mixture, and a method of manufacturing an integrated circuit (IC) device by using the etching gas mixture.

2. Description of the Related Art

With the advance of electronic technology, down-scaling of semiconductor devices may be quickly made, and as a design rule for IC devices is reduced, a critical dimension of each of the semiconductor devices may be rapidly reduced.

SUMMARY

The embodiments may be realized by providing an etching gas mixture including a C1-C3 perfluorinated alkyl hypofluorite; and a C1-C10 organosulfur compound that includes a C—S bond.

The embodiments may be realized by providing a method of forming a pattern, the method including etching a thin layer using the etching gas mixture according to an embodiment.

The embodiments may be realized by providing a method of forming a pattern, the method including forming an etch mask pattern on a thin layer such that the etch mask pattern includes an opening; forming a sulfur-containing passivation layer that covers the etch mask pattern by etching a portion of the thin layer through the opening by using plasma obtained from the etching gas mixture according to an embodiment; and forming a thin layer pattern by further etching the thin layer through the opening by using the etch mask pattern and the sulfur-containing passivation layer as an etch mask and by using the plasma obtained from the etching gas mixture.

The embodiments may be realized by providing a method of manufacturing an integrated circuit device, the method including forming a structure on a substrate such that the structure includes a silicon-containing thin layer; forming a photoresist pattern on the structure such that the photoresist pattern includes a plurality of openings; forming a sulfur-containing passivation layer covering the photoresist pattern by etching a portion of the silicon-containing thin layer through the plurality of openings by using plasma obtained from an etching gas mixture, the etching gas mixture including a C1-C3 perfluorinated alkyl hypofluorite and a C1-C10 organosulfur compound that includes a C—S bond; and forming a thin layer pattern by further etching the silicon-containing thin layer through the plurality of openings by using the photoresist pattern and the sulfur-containing passivation layer as an etch mask and by using the plasma obtained from the etching gas mixture.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
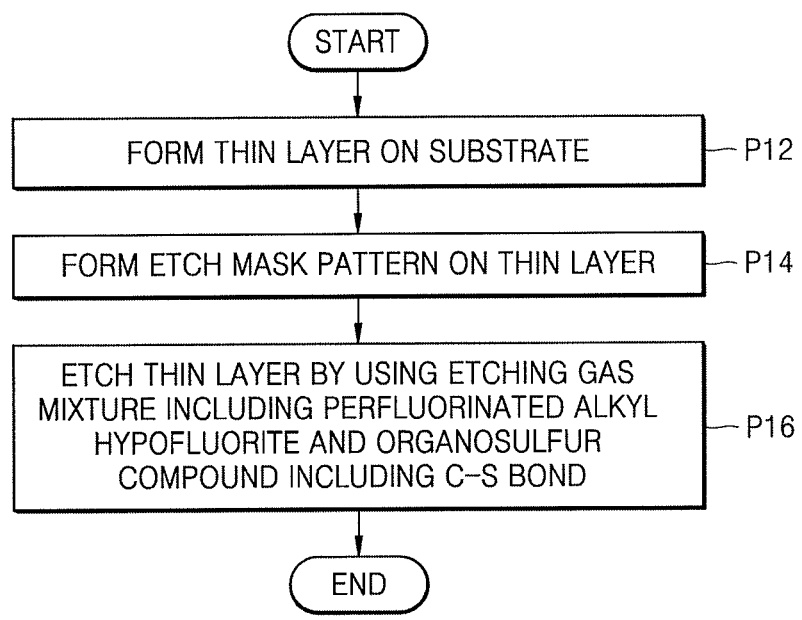
FIG. 1 illustrates a flowchart of a method of forming a pattern, according to embodiments.

An etching gas mixture according to an embodiment may include, e.g., a C1-C3 perfluorinated alkyl hypofluorite and a C1-C10 organosulfur compound including a C—S bond.

The C1-C3 perfluorinated alkyl hypofluorite may include, e.g., a compound including a C1-C3 fluorinated alkyl group and a —OF group. When etching a silicon (Si)-containing thin layer, the C1-C3 perfluorinated alkyl hypofluorite may provide a good etch rate. Unlike fluorinated hydrocarbons or perfluorocarbons that have a relatively long atmospheric lifetime and a relatively high GWP index, e.g., $CF_4$, $CHF_3$, $C_2F_6$, $C_3F_8$, or $C_4F_8$, perfluorinated alkyl hypofluorite may have a very low GWP index "1" and may be decomposed in the air, and thus, may hardly have an adverse effect on global warming.

In an implementation, the perfluorinated alkyl hypofluorite may include, e.g., trifluoromethyl hypofluorite ($CF_3OF$). $CF_3OF$ may provide a considerably high etch rate for a Si-containing film, in comparison with fluorinated hydrocarbons or perfluorocarbons. For example, $CF_3OF$ may provide an etch rate which is about twice higher than $CF_4$, for silicon nitride.

A molecular weight of $CF_3OF$ may be 104 g/mol and may be similar to the molecular weight, 88 g/mol, of $CF_4$, which is another etching gas, and a boiling point of $CF_3OF$ may be −95° C., which may be similar to the −128° C. boiling point of $CF_4$.

The following Reaction Formula 1 illustrates a reaction between $CF_3OF$ and $Si_3N_4$.

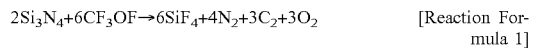

[Reaction Formula 1]

As seen in Reaction Formula 1, perfluorinated alkyl hypofluorite (e.g., $CF_3OF$) may be usefully used when etching a $Si_3N_4$ film.

The etching gas mixture according to an embodiment may include the C1-C3 perfluorinated alkyl hypofluorite, and an eco-friendly dry etching process where a GWP index is low may be effectively implemented by using the etching gas mixture.

The organosulfur compound included in the etching gas mixture according to an embodiment may include, e.g., a fluorinated hydrocarbon compound represented by $C_xH_yF_zS_u$ (in which x may be an integer of one to ten, y may be an integer of zero to ten, z may be an integer of one to twenty, and u may be an integer of one to four). In an implementation, the organosulfur compound may include, e.g., a perfluorocarbon compound including no hydrogen atom (H), $CH_2F_4S$, $CHF_3S$, $CHF_7S$, CHFS, $C_2H_7FS$, $C_2H_3F_5S$, $C_2H_3F_3S_2$, $C_2H_3F_3S$, $C_2HF_7S$, $C_3H_5F_3S_2$, $C_3HF_3S$, $C_4H_3FS$, $C_4H_7F_3S$, $C_6H_2F_4S$, $C_6H_5FS$, $C_6H_8F_2S$, $C_6HF_5S$, $C_7H_4F_4S$, $C_7H_5F_3S$, $C_7H_7FS$, or a combination thereof.

The perfluorocarbon compound may be compound where all hydrogen atoms normally bonded to carbons in a molecule are replaced with fluorine atoms, e.g., may denote a compound where all of C—H bonds are replaced with C—F bonds in the molecule. In an implementation, the organosulfur compound may include, e.g., one of the following perfluorocarbon compounds.

(1) CFS (methanethioyl fluoride: CAS No. 104959-43-5)
(2) $CF_2S$ (thiocarbonyl fluoride; CAS No. 420-32-6)
(3) $CF_3S$ (Trifluormethanthiyl-Radikal: CAS No. 29245-71-4)
(4) $CF_8S$ (trifluoromethyl sulfur pentafluoride: CAS No. 373-80-8),
(5) $C_2F_4S_2$ (trifluoromethylmercaptothiocarbonyl fluoride: CAS No. 371-73-3)
(6) $C_2F_4S_2$ (tetrafluoro-1,3-dithietane: CAS No. 1717-50-6)
(7) $C_2F_6S$ (trifluoro(trifluoromethylsulfanyl)methane: CAS No. 371-78-8)
(8) $C_2F_6S_2$ (trifluoro-(trifluoromethyldisulfanyl)methane: CAS No. 372-64-5)
(9) $C_2F_6S_3$ (trifluoro-(trifluoromethyltrisulfanyl)methane: CAS No. 372-06-5)
(10) $C_2F_6S_4$ (trifluoro-(trifluoromethyltetrasulfanyl)methane: CAS No. 372-07-6)
(11) $C_2F_8S$ (difluorobis(trifluoromethyl)sulfur(IV): CAS No. 30341-38-9)
(12) $C_2F_8S$ (1,1,2-trifluoro-2-pentafluorosulfanylethene: CAS No. 1186-51-2)
(13) $C_2F_{10}S$ (trans-tetrafluorobis-(trifluoromethyl)sulfur: CAS No. 42179-02-2)
(14) $C_2F_{10}S$ (pentafluoro(1,1,2,2,2-pentafluoroethyl)-λ6-sulfane: CAS No. 354-67-6)
(15) $C_3F_6S_3$ (bis(trifluoromethylsulfanyl)methanethione: CAS No. 461-08-5)
(16) $C_4F_{16}S_2$ (hexadecafluoro-octahydro-1,4-dithiane: CAS No. 4556-31-4)
(17) $C_4F_6S$ (3,3,3-trifluoro-2-(trifluoromethyl)prop-1-ene-1-thione: CAS No. 7445-60-5)
(18) $C_4F_6S$ (2,2,3,4,5,5-hexafluorothiophene: CAS No. 380-40-5)
(19) $C_4F_6S_2$ (3,4-bis(trifluoromethyl)-1,2-dithiete: CAS No. 360-91-8)
(20) $C_4F_8S$ (octafluorotetrahydrothiophene: CAS No. 706-76-3)
(21) $C_4F_8S$ (2,2-difluoro-3,3-bis(trifluoromethyl)thiirane: CAS No. 2261-43-0)
(22) $C_6F_{16}S$ (perfluorocyclohexanesulfurpentafluoride: CAS No. 1423-17-2)

In an implementation, the etching gas mixture may include the C1-C3 perfluorinated alkyl hypofluorite and the C1-C10 organosulfur compound including the C—S bond. In an implementation, the perfluorinated alkyl hypofluorite may be present in an amount of, e.g., about 10 vol % to about 99 vol % of a total volume of the etching gas mixture, and the organosulfur compound may be present in an amount of, e.g., about 1 vol % to about 90 vol % of the total volume of the etching gas mixture.

When etching a nitride layer by using plasma obtained from the etching gas mixture including the C1-C10 organosulfur compound including the C—S bond, non-volatile radicals such as CS, $CS_2$, S, and $S_2$ may be generated. A sulfur-containing passivation layer covering a surface of a photoresist pattern, which is used as an etch mask when etching the nitride layer, may be generated from the non-volatile radicals. The sulfur-containing passivation layer may include a carbon-based (e.g., organic or carbon-containing) polymer including a C—S bond.

For example, in a case where an organosulfur compound including sulfur (S) is included in an etching gas mixture for etching a $Si_3N_4$ layer, a reaction represented by the following Reaction Formula 2 may be performed, and thus, an etch rate of the $Si_3N_4$ layer is enhanced and a CS radical may be generated as a reaction by-product.

[Reaction Formula 2]

As the nitride layer is being etched, CS, which is a S-containing reaction by-product, may cover an exposed surface of an etch mask (e.g., a photoresist pattern), and the S-containing passivation layer may protect the photoresist pattern, thereby preventing a deformation of the photoresist pattern. An etch selectivity of the nitride layer may increase due to the S-containing passivation layer, and a line edge roughness (LER) of an etch surface of a nitride pattern obtained as a result of the etching of the nitride layer is improved.

In an implementation, the etching gas mixture according to an embodiment may further include an inert gas. In this case, the etching gas mixture according to an embodiment may include the C1-C3 perfluorinated alkyl hypofluorite, the C1-C10 organosulfur compound including the C—S bond, and the inert gas. In an implementation, the perfluorinated alkyl hypofluorite may be included in an amount of, e.g., about 10 vol % to about 99 vol % of the total volume of the etching gas mixture, the organosulfur compound may be included in an amount of, e.g., about 0.1 vol % to about 90 vol % of the total volume of the etching gas mixture, and the inert gas may be included in an amount of, e.g., about 0.0001 vol % to about 10 vol % of the total volume of the etching gas mixture. In an implementation, the inert gas may include, e.g., Ar, He, Ne, $N_2$, or a combination thereof.

FIG. 1 illustrates a flowchart of a method of forming a pattern, according to embodiments.

FIGS. 2A to 2E illustrate cross-sectional views of stages in a method of forming a pattern, according to embodiments.

Figure 2A:
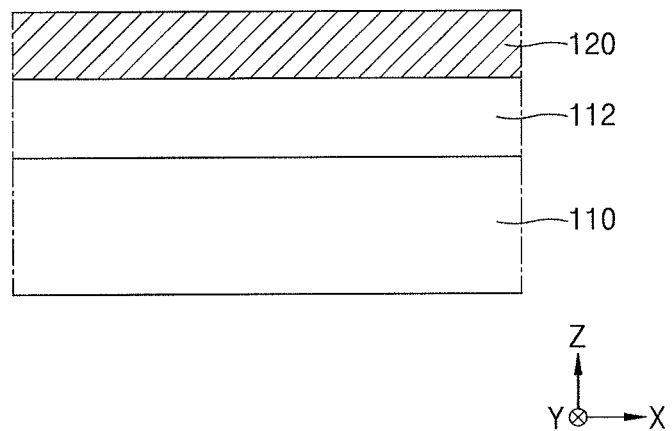
FIGS. 2A to 2E illustrate cross-sectional views of stages in a method of forming a pattern, according to embodiments.

Referring to FIGS. 1 and 2A, in a process P12, a thin layer 120 may be formed on a substrate 110.

The substrate 110 may be a semiconductor substrate. In an implementation, the, the substrate 110 may include, e.g., a semiconductor, such as Si or germanium (Ge), or a compound semiconductor such as SiGe, SiC, GaAs, InAs, or InP.

A lower structure 112 may be formed on the substrate 110, and the thin layer 120 may be formed on the lower structure 112. The lower structure 112 may be an insulation layer or a conductive layer. In an implementation, the lower structure 112 may include, e.g., a metal, an alloy, metal carbide, metal nitride, metal oxynitride, metal oxycarbide, a semiconductor, polysilicon, or a combination thereof. In an implementation, the lower structure 112 may include, e.g., a polysilicon layer, or a carbon-containing layer such as an amorphous carbon layer (ACL) or a spin-on hardmask (SOH) material. In an implementation, the carbon-containing layer including the SOH material may include, e.g., an organic compound having a relatively high carbon content corresponding to about 85 wt % to about 99 wt % of a total weight of the carbon-containing layer. In an implementation, the organic compound may include, e.g., a hydrocarbon compound including an aromatic ring, or derivatives thereof.

In an implementation, the thin layer 120 may include, e.g., a $Si_3N_4$ layer, a $SiO_2$ layer, a SiON layer, a SiCN layer, a SiC layer, a SiOC layer, a hydrogenated amorphous silicon nitride layer (a-SiN:H layer), or a combination thereof.

Figure 2B:
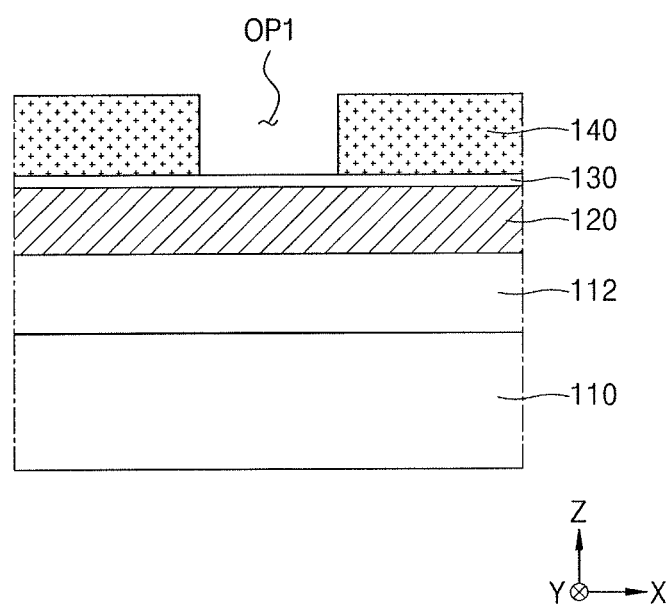

Referring to FIGS. 1 and 2B, in a process P14, an etch mask pattern 140 may be formed on the thin layer 120.

An anti-reflection layer 130 may be disposed between the thin layer 120 and the etch mask pattern 140. In an implementation, the anti-reflection layer 130 may include, e.g., an inorganic anti-reflection layer, an organic anti-reflection layer, or a combination thereof. In an implementation, the inorganic anti-reflection layer may include an inorganic material, e.g., titanium, titanium dioxide, titanium nitride, chromium oxide, carbon, silicon nitride, silicon oxynitride, or amorphous silicon. In an implementation, the organic anti-reflection layer may include, e.g., a crosslinked polymer having Si content of about 10 wt % to about 50 wt %. A Si-containing organic anti-reflection layer may be obtained from a sold product (e.g., Sepr-Shb Aseries SiARC sold by Shin Etsu Chemical Co., Ltd.). In an implementation, the anti-reflection layer 130 may be omitted.

The etch mask pattern 140 may be a photoresist pattern. In an implementation, the etch mask pattern 140 may include, e.g., a chemical amplified photoresist including resin having an acid-labile group and a photoacid generator (PAG). In an implementation, the etch mask pattern 140 may include, e.g., a KrF excimer laser (248 nm) resist, an ArF excimer laser (193 nm) resist, a $F_2$ excimer laser (157 nm) resist, or an extreme ultraviolet (EUV) (13.5 nm) resist.

In an implementation, the etch mask pattern 140 may include a plurality of line patterns having a planar shape which extends long in a Y direction. The etch mask pattern 140 may include an opening OP1 provided between adjacent line patterns of the plurality of line patterns. The planar shape of the opening OP1 may be a linear shape which extends long in the Y direction.

Figure 2C:
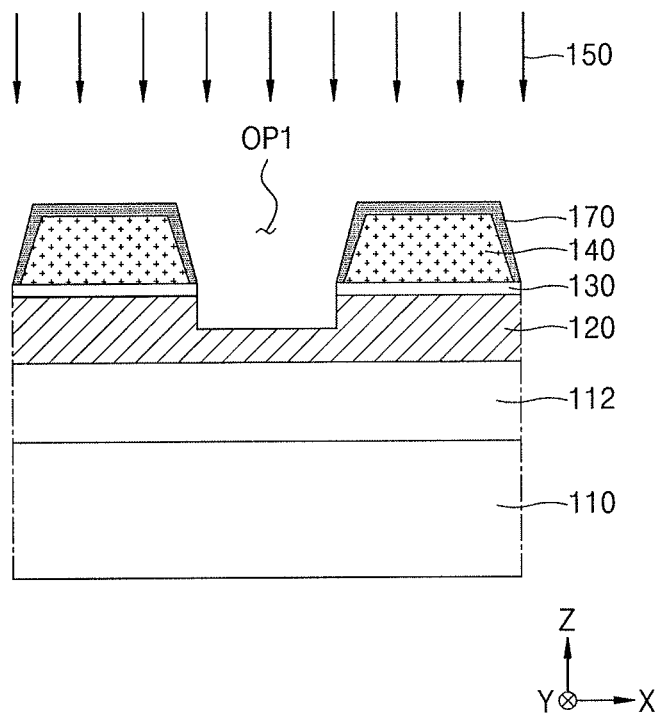

Referring to FIGS. 1 and 2C, in a process P16, the thin layer 120 may be exposed by etching the anti-reflection layer 130 through the opening OP1 of the etch mask pattern 140, and then, by using an etching gas mixture 150 according to embodiments, a portion of the thin layer 120 exposed through the opening OP1 may be etched.

In an implementation, the etching gas mixture 150 according to embodiments may be used for etching the anti-reflection layer 130 and the thin layer 120.

In an implementation, the etching gas used to etch the anti-reflection layer 130 may be an etching gas having a composition different from that of the etching gas mixture 150 used to etch the thin layer 120. For example, if the anti-reflection layer 130 includes a Si-containing organic anti-reflection layer, the anti-reflection layer 130 may be plasma-etched by using an etching gas including a $C_xF_yH_z$-containing gas (in which each of x and y may be an integer of one to ten, and z may be an integer of zero to ten). The $C_xF_yH_z$-containing gas may be a gas including carbon (C) and fluorine (F) or a gas including C, F, and hydrogen (H). For example, the $C_xF_yH_z$-containing gas may include $CF_4$, $C_3F_6$, $C_4F_6$, $C_4F_8$, $C_5F_8$, $CHF_3$, $CH_2F_2$, or a combination thereof. In an implementation, the etching gas may further include an inert gas such as argon (Ar).

In an implementation, the etching gas mixture 150 may include, e.g., $CF_3OF$ and a fluorinated hydrocarbon compound. The fluorinated hydrocarbon compound may be represented as $C_xH_yF_zS_u$, (in which x may be an integer of one to ten, y may be an integer of zero to ten, z may be an integer of one to twenty, and u may be an integer of one to four). A detailed example of the fluorinated hydrocarbon compound is as described above.

In an implementation, the etching gas mixture 150 may include, e.g., a C1-C3 perfluorinated alkyl hypofluorite and a C1-C10 organosulfur compound including a C—S bond. In an implementation, the etching gas mixture 150 may include, e.g., the C1-C3 perfluorinated alkyl hypofluorite, the C1-C10 organosulfur compound including the C—S bond, and an inert gas. An exemplary content of each of the elements of the etching gas mixture 150 is as described above.

The etching gas mixture 150 may be provided to the thin layer 120 as a plasma type including chemical species which are exposed to an energy source and activated. A plasma etch device may be used for etching the thin layer 120 with plasma of the etching gas mixture 150. For example, a reactive ion etch (ME) device, a magnetically enhanced reactive ion etch (MERIE) device, an inductively coupled plasma (ICP) device, a transformer coupled plasma (TCP) device, a hollow anode type plasma device, a helical resonator plasma device, an electron cyclotron resonance (ECR)

device, and/or the like may be used for etching the thin layer 120 with the plasma of the etching gas mixture 150.

Figure 3:
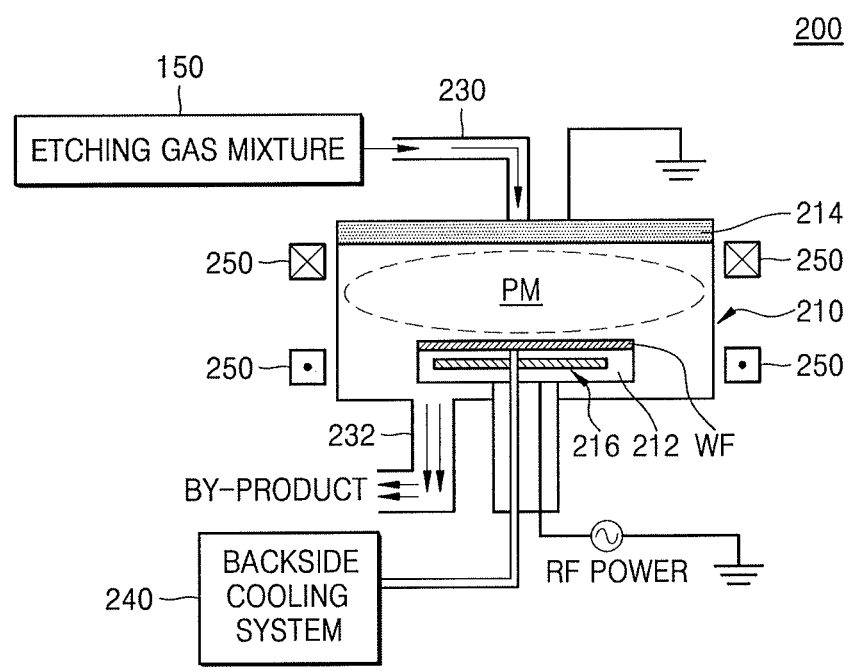
FIG. 3 illustrates a diagram of an exemplary configuration of a plasma etch device capable of being applied to a method of forming a pattern.

FIG. 3 illustrates a diagram for describing an exemplary configuration of a plasma etch device capable of being applied to a method of forming a pattern. In FIG. 3, a schematic configuration of the MERIE device is illustrated.

Referring to FIG. 3, a method of forming a pattern according to embodiments may be performed by using a plasma etch device 200.

In an implementation, a structure WF may be disposed on a chuck 212 in a reaction chamber 210 of the plasma etch device 200. The structure WF, as illustrated in FIG. 2B, may be a resultant material where an etch mask pattern 140 is formed on a substrate 110.

In the reaction chamber 210, the chuck 212 and a shower head 214 may be opposite to each other and may extend in parallel. The chuck 212 and the shower head 214 may configure a pair of conductive plate electrodes. For example, a radio frequency (RF) power of 13.56 MHz may be supplied to the chuck 212, and the shower head 214 may be electrically grounded, whereby plasma PM may be excited between the chuck 212 and the shower head 214. A temperature control device 216 may be embedded into the chuck 212 to maintain a temperature of the structure WF as a desired constant temperature. In order to etch a thin layer 120 included in the structure WF by using the plasma PM of an etching gas mixture 150, an internal temperature of the structure WF and an internal temperature of a reaction chamber 210 may be maintained at, e.g., about 10° C. to about 240° C., by the temperature control device 216. In an implementation, the internal temperature of the reaction chamber 210 may be maintained at a temperature of about 10° C. to about 100° C., e.g., a temperature of about 10° C. to about 70° C. The etching gas mixture for etching the thin layer 120 formed on the substrate 110 may be introduced into the reaction chamber 210 through a gas supply pipe 230 and the shower head 214. A backside cooling system 240 may be connected to the chuck 212. The backside cooling system 240 may supply cooling helium to the chuck 212. The thin layer 120 may be etched by the plasma PM of the etching gas mixture 150, and then, non-reaction materials or non-volatile reaction by-products remaining in the reaction chamber 210 may be discharged through a discharging port 232 by using a turbo pump. A magnetic coil 250 may be installed near the reaction chamber 210.

In an implementation, a power of about 100 W to about 1,000 W may be applied to the reaction chamber 210 in order to etch the thin layer 120 (e.g., the thin layer 120 included in a resultant material illustrated in FIG. 2B) included in the structure WF. In an implementation, a process of etching the thin layer 120 in the reaction chamber 210 may be maintained for about five seconds to about five minutes. In an implementation, the time may be adjusted based on various variables of the etching process.

In an implementation, the plasma etch device 200 may have a configuration as illustrated in FIG. 3. In an implementation, the device may be variously modified and changed without departing from the technical spirit of the present disclosure.

Referring again to FIG. 2C, as the thin layer 120 is being etched using the etching gas mixture 150, a portion of the thin layer 120 may be consumed from exposed surfaces of the etch mask pattern 140, and thus, a height and a width of the etch mask pattern 140 may be finely reduced. As a process of etching the thin layer 120 with the etching gas mixture 150 is continuously performed, non-volatile radicals such as CS among etch by-products generated in the process of etching the thin layer 120 may be adsorbed onto the exposed surfaces of the etch mask pattern 140, and thus, a S-containing passivation layer 170 covering the etch mask pattern 140 may be formed.

For example, if the etching gas mixture 150 includes $CF_3OF$ and $CF_8S$ and the thin layer 120 includes a $Si_3N_4$ layer, a reaction based on Reaction Formula 1 and a reaction based on Reaction Formula 2 may be performed. Therefore, when etching a nitride layer by using plasma obtained from the etching gas mixture including the C1-C10 organosulfur compound including the C—S bond, a non-volatile radical including CS may be generated based on Reaction Formula 2. The S-containing passivation layer 170 covering a surface of the etch mask pattern 140 may be generated from the non-volatile radical. The S-containing passivation layer 170 may include an organic polymer including a C—S bond. The S-containing passivation layer 170 protects the etch mask pattern, thereby preventing a deformation of the etch mask pattern. The S-containing passivation layer 170 may act as an etch mask along with the etch mask pattern 140. An etch selectivity of the thin layer 120 is enhanced by the S-containing passivation layer 170 while a subsequent process of etching the thin layer 120 is further performed.

Figure 2D:
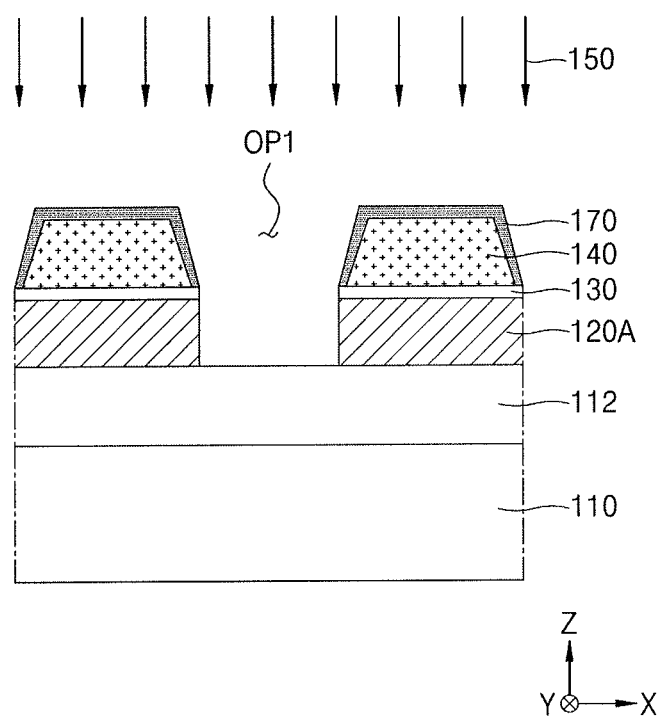

Referring to FIG. 2D, after the S-containing passivation layer 170 may be formed, a thin layer pattern 120A may be formed by further etching the thin layer 120 exposed through the opening OP1 by using plasma obtained from the etching gas mixture 150 according to the process P16 of FIG. 1. In an implementation, a thickness of the S-containing passivation layer 170 may incrementally increase while the thin layer pattern 120A is being formed.

A process of forming the S-containing passivation layer 170 described above with reference to FIG. 2C and a process of forming the thin layer pattern 120A described above with reference to FIG. 2D may be successively performed in the same chamber. For example, the process of forming the S-containing passivation layer 170 and the process of forming the thin layer pattern 120A described above with reference to FIG. 2D may be in-situ performed in the reaction chamber 210 of the plasma etch device 200 illustrated in FIG. 3.

Figure 2E:
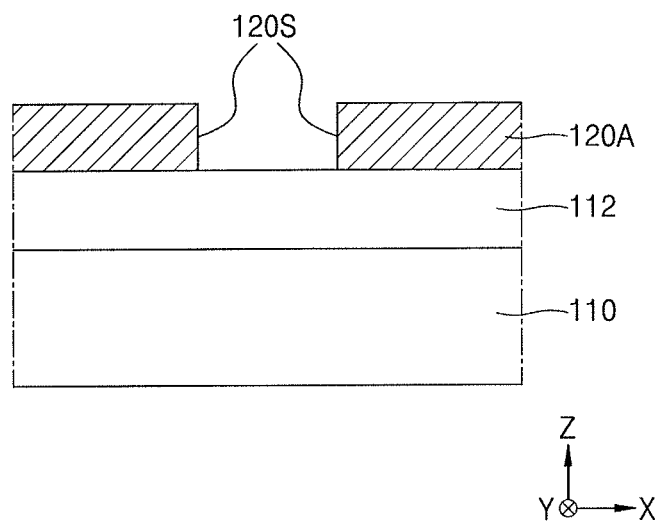

Referring to FIG. 2E, a top of the thin layer pattern 120A may be exposed by removing the etch mask pattern 140, the S-containing passivation layer 170, and the anti-reflection layer 130 which remain on the thin layer pattern 120A. In an implementation, an ashing process and a strip process may be used for removing the etch mask pattern 140, the S-containing passivation layer 170, and the anti-reflection layer 130. In some other embodiments, the anti-reflection layer 130 may be removed by a wet etching process.

In the thin layer pattern 120A obtained by etching the thin layer 120 with plasma obtained from the etching gas mixture 150 by using the etch mask pattern 140 and the S-containing passivation layer 170 as an etch mask, an LER characteristic of a side wall 120S extending in a lengthwise direction (a Y direction) of the thin layer pattern 120A is enhanced.

Figure 4:
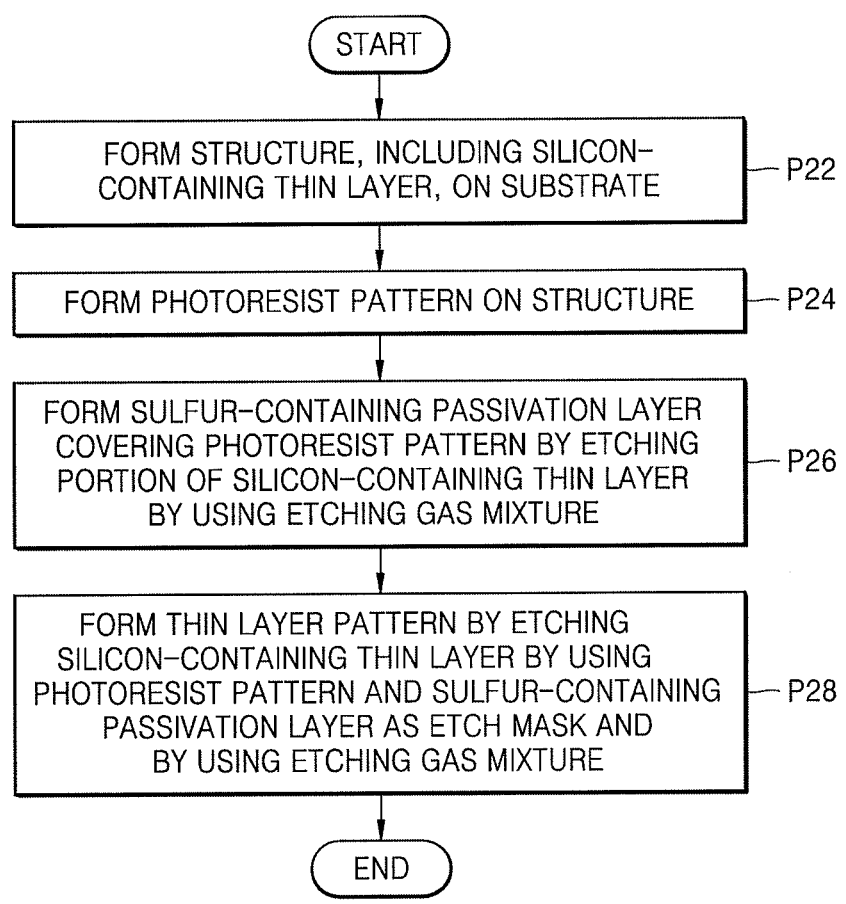
FIG. 4 illustrates a flowchart of a method of manufacturing an IC device, according to embodiments.

FIG. 4 illustrates a flowchart of a method of manufacturing an IC device, according to embodiments.

FIGS. 5A to 9B illustrate diagrams showing stages in a method of manufacturing an IC device, according to embodiments. FIGS. 5A, 6A, 7A, 8A, and 9A illustrate plan views of stages in a method of manufacturing an IC device, according to embodiments. FIGS. 5B, 6B, 7B, 8B, and 9B are cross-sectional views taken along lines B-B' of FIGS. 5A, 6A, 7A, 8A, and 9A, respectively. In FIGS. 5A to 9B, like reference numerals in FIGS. 2A to 2E refer to like elements, and their repetitive descriptions may be omitted.

Figure 5A:
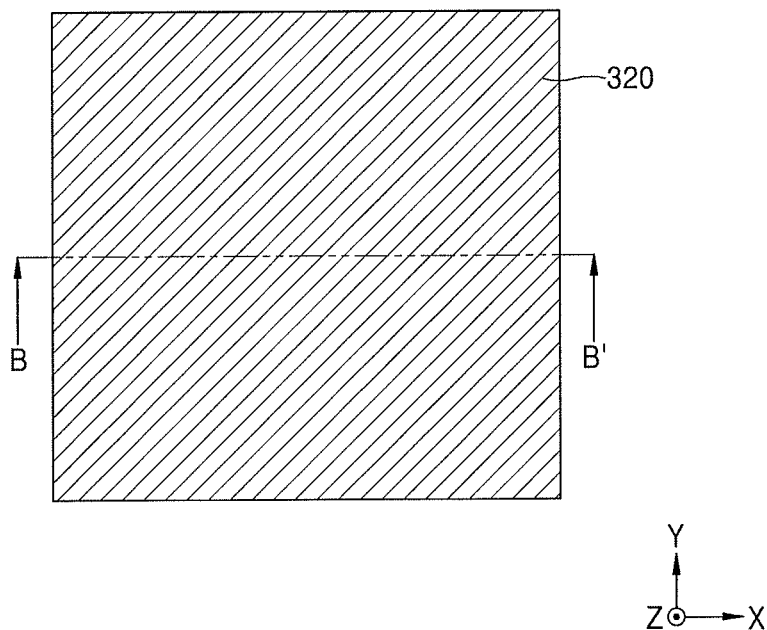
FIGS. 5A, 6A, 7A, 8A, and 9A illustrate plan views of stages in a method of manufacturing an IC device, according to embodiments.
Figure 5B:
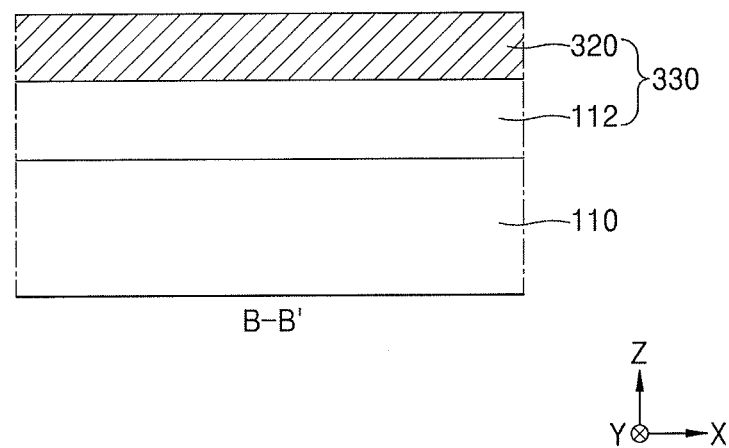
FIGS. 5B, 6B, 7B, 8B, and 9B illustrate cross-sectional views taken along lines B-B' of FIGS. 5A, 6A, 7A, 8A, and 9A, respectively.

Referring to FIGS. 4, 5A, and 5B, in a process P22, a structure 330 including a Si-containing thin layer 320 may be formed on a substrate 110.

The structure 330 may be a structure for manufacturing an IC device. For example, the structure 330 may be a structure for manufacturing dynamic random access memory (DRAM), magnetic RAM (MRAM), static RAM (SRAM), phase change RAM (PRAM), resistance RAM (RRAM), ferroelectric RAM (FRAM), vertical channel NAND (VNAND) flash memory, or a logic device including various logic cells.

The structure 330 may include a lower structure 112 formed on the substrate 110 and a Si-containing thin layer 320 covering the lower structure 112. The Si-containing thin layer 320 may include a material having an etch selectivity that is different from that of a material of a portion forming an uppermost surface of the lower structure 112.

In an implementation, the Si-containing thin layer 320 may include, e.g., a $Si_3N_4$ layer, a $SiO_2$ layer, a SiON layer, a SiCN layer, a SiC layer, a SiOC layer, an a-SiN:H layer, or a combination thereof.

Figure 6A:
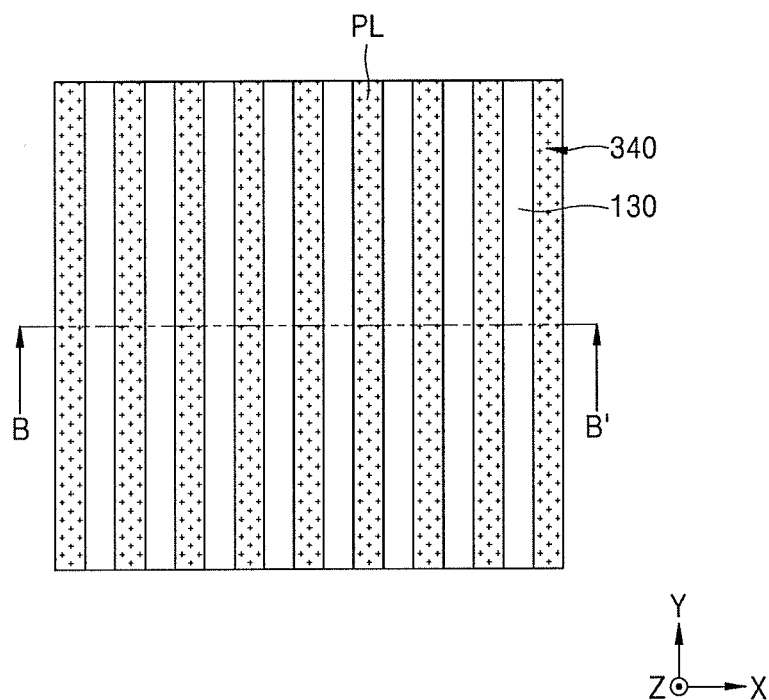
Figure 6B:
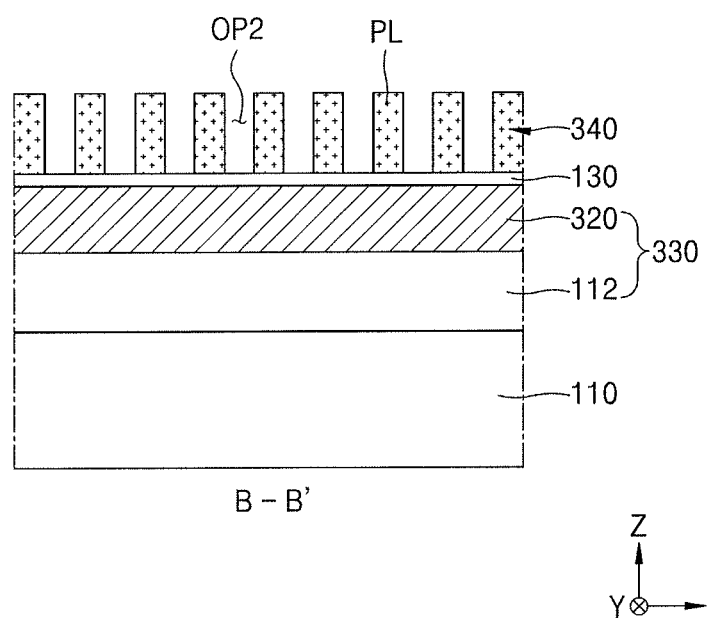

Referring to FIGS. 4, 6A, and 6B, in a process P24, a photoresist pattern 340 may be formed on the structure 330.

The photoresist pattern 340 may include a plurality of photoresist line patterns PL which extend in parallel in a Y direction and are spaced apart from each other with an opening OP2 therebetween. The opening OP2 may be provided in plurality. A planar surface of each of the plurality of photoresist line patterns PL and the plurality of openings OP2 may have a linear shape which extends long in the Y direction. In an implementation, the plurality of photoresist line patterns PL may be arranged at certain pitches in an X direction. In an implementation, the photoresist pattern 340 may include a chemical amplifying type photoresist. The photoresist pattern 340 may include, e.g., a KrF excimer laser (248 nm) resist, an ArF excimer laser (193 nm) resist, a $F_2$ excimer laser (157 nm) resist, or a BUY (13.5 nm) resist.

An anti-reflection layer 130 may be disposed between the Si-containing thin layer 320 and the etch mask pattern 340.

Figure 7A:
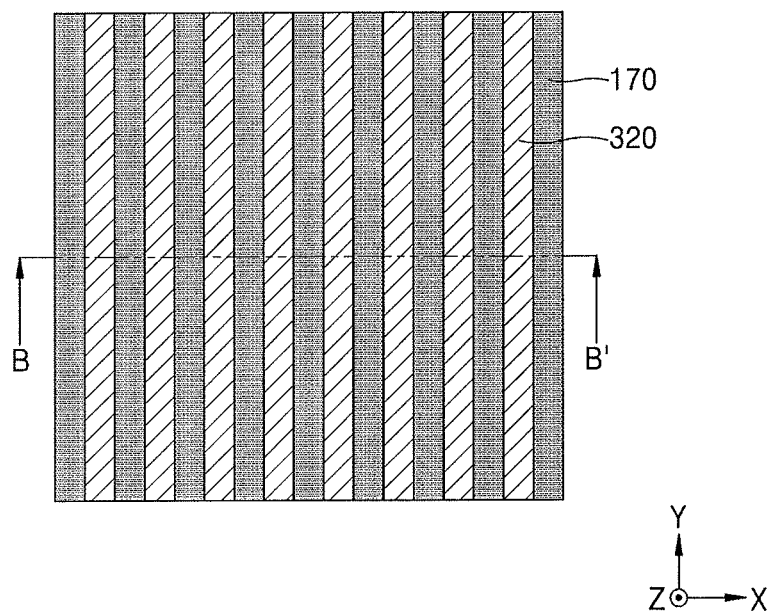
Figure 7B:
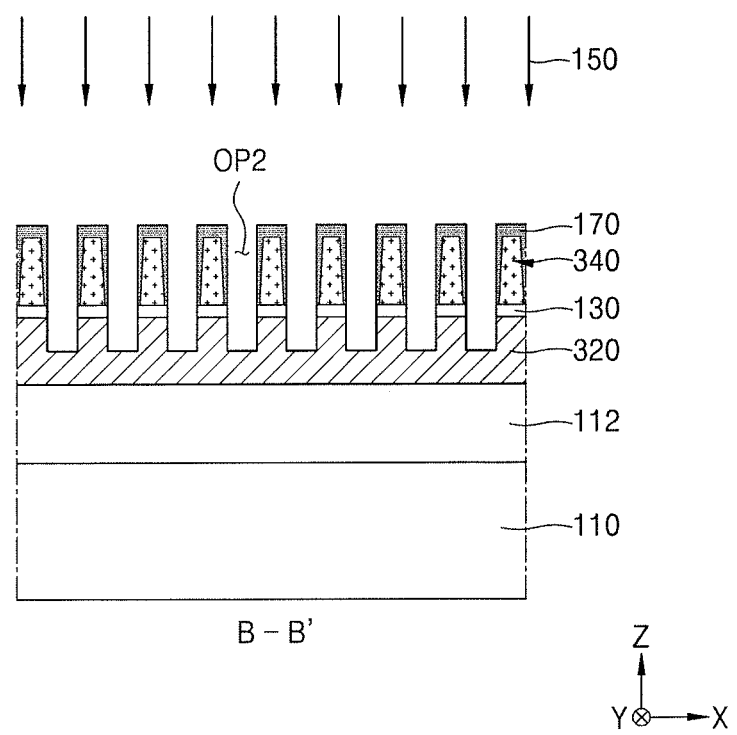

Referring to FIGS. 4, 7A, and 7B, in a process P26, the Si-containing thin layer 320 may be exposed by etching the anti-reflection layer 130 through the opening OP2, and then, the S-containing passivation layer 170 covering the photoresist pattern 340 may be formed by etching a portion of the Si-containing thin layer 320 through the plurality of openings OP2 by using plasma obtained from the etching gas mixture 150 according to embodiments.

A process of etching the anti-reflection layer 130 refers to description given above with reference to FIG. 2C.

In an implementation, the etching gas mixture 150 may include, e.g., $CF_3OF$ in an amount of about 10 vol % to about 99 vol % and $CF_8S$ in an amount of about 1 vol % to about 90 vol % with respect to a total volume of the etching gas mixture 150. In an implementation, the etching gas mixture 150 may include, e.g., $CF_3OF$ in an amount of about 10 vol % to about 99 vol %, a perfluorocarbon compound in an amount of about 0.1 vol % to about 90 vol %, and an inert gas in an amount of about 0.0001 vol % to about 10 vol % with respect to a total volume of the etching gas mixture 150. Detailed descriptions of the etching gas mixture 150 and the S-containing passivation layer 170 refer to a description of the process P16 given above with reference to FIGS. 1 and 2C.

Figure 8A:
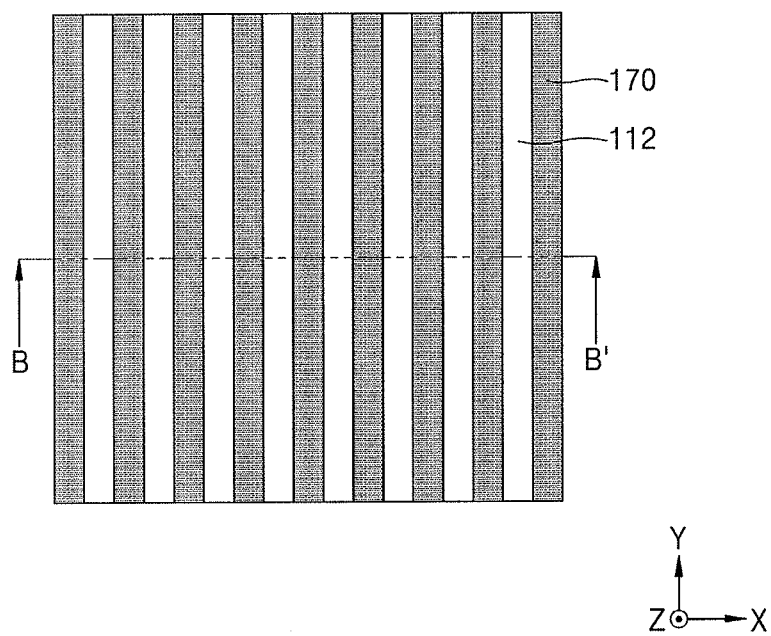
Figure 8B:
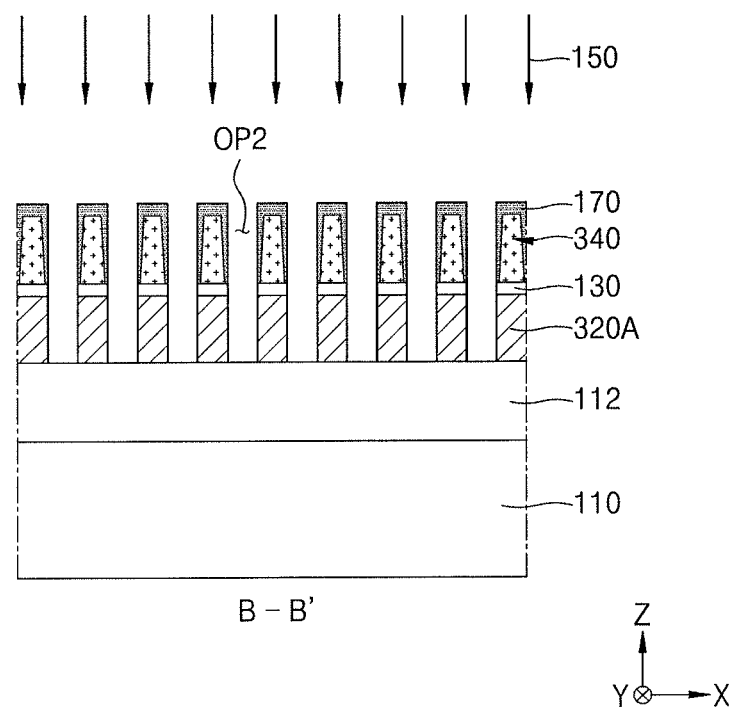

Referring to FIGS. 4, 8A, and 8B, in a process P28, a thin layer pattern 320A may be formed by further etching the Si-containing thin layer 320 through the plurality of openings OP2 by using the etching gas mixture 150 and by using the photoresist pattern 340 and the S-containing passivation layer 170 as an etch mask.

As the Si-containing thin layer 320 is being etched through the plurality of openings OP2, the S-containing passivation layer 170 protects the photoresist pattern 340, thereby preventing a deformation of the photoresist pattern 340. The S-containing passivation layer 170 may act as an etch mask along with the photoresist pattern 340. An etch selectivity of the Si-containing thin layer 320 is enhanced by the S-containing passivation layer 170 while a subsequent process of etching the Si-containing thin layer 320 is being performed.

The thin layer pattern 320A may include a plurality of line patterns that extend long in the Y direction. The plurality of line patterns may be arranged at certain pitches in the X direction.

A process of forming the S-containing passivation layer 170 described above with reference to FIGS. 7A and 7B and a process of forming the thin layer pattern 320A described above with reference to FIGS. 8A and 8B may be successively performed in the same chamber. For example, the process of forming the S-containing passivation layer 170 and the process of forming the thin layer pattern 320A described above with reference to FIGS. 8A and 8B may be performed in-situ in the reaction chamber 210 of the plasma etch device 200 illustrated in FIG. 3.

Figure 9A:
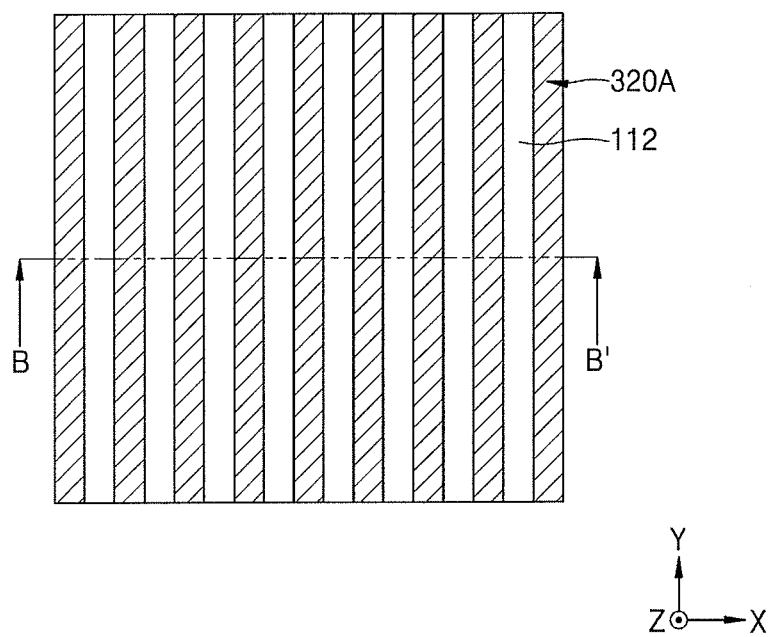
Figure 9B:
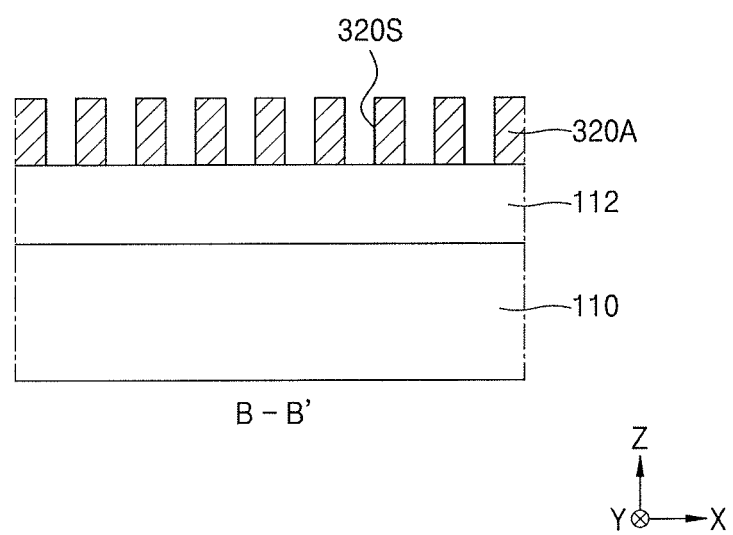

Referring to FIGS. 9A and 9B, a top of the thin layer pattern 320A may be exposed by removing the photoresist pattern 340, the S-containing passivation layer 170, and the anti-reflection layer 130, which remain on the thin layer pattern 320A, from a resultant material of FIGS. 8A and 8B by using a method similar to the process of removing the etch mask pattern 140, the S-containing passivation layer 170, and the anti-reflection layer 130 described above with reference to FIG. 2E.

In the thin layer pattern 320A obtained by etching the Si-containing thin layer 320 with plasma obtained from the etching gas mixture 150 by using the photoresist pattern 340 and the S-containing passivation layer 170 as an etch mask, an LER characteristic of a side wall 320S extending in a lengthwise direction (a Y direction) of the thin layer pattern 320A is enhanced.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Evaluation Example 1

A $Si_3N_4$ layer was plasma-etched by using a $CF_3OF$ gas so as to evaluate an etch characteristic of $CF_3OF$ which is a type of perfluorinated alkyl hypofluorite capable of constituting the etching gas mixture according to an embodiment. As a Comparative Example, a result obtained by plasma-etching the $Si_3N_4$ layer with the $CF_4$ gas was compared with the Evaluation Example 1. In this case, in order to perform the plasma-etching, the MERIE device illustrated in FIG. 3 was used, the inside of a reaction chamber of the MERIE device has maintained pressure of 200 mTorr and a temperature of 20° C. while the $Si_3N_4$ layer is being plasma-etched, and a source power of 800 W was applied to the reaction chamber. Under such a condition, a plasma-etching process was performed on the $Si_3N_4$ layer for thirty seconds while supplying an etching gas to the reaction chamber at a flow rate of 100 sccm.

Figure 10:
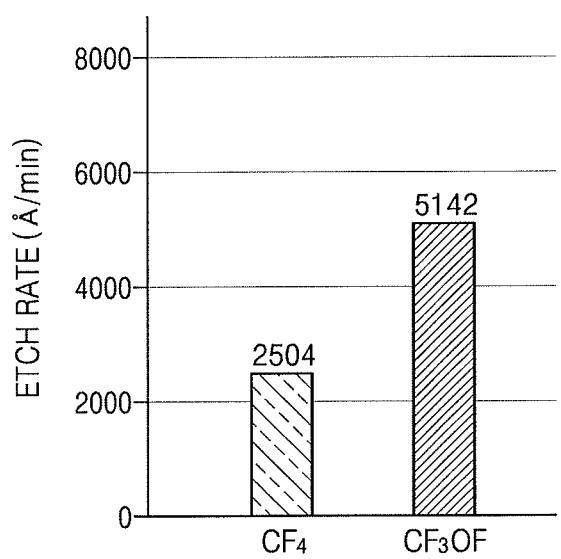
FIG. 10 illustrates a graph showing a result obtained by evaluating an etch rate in each of a case where a $CF_3OF$ gas is used as an etching gas and a case where a $CF_4$ gas is used as an etching gas, in plasma-etching a $Si_3N_4$ layer.

FIG. 10 illustrates a graph showing a result obtained by evaluating an etch rate in each of a case where a $CF_3OF$ gas is used as an etching gas according to Evaluation Example 1 and a case where a $CF_4$ gas is used as an etching gas according to the Comparative Example, in plasma-etching a $Si_3N_4$ layer.

In a result of FIG. 10, it may be seen that an etch rate of the $Si_3N_4$ layer is about 2 or more times higher in a case of using the $CF_3OF$ gas than a case of using the $CF_4$ gas.

Figure 11:
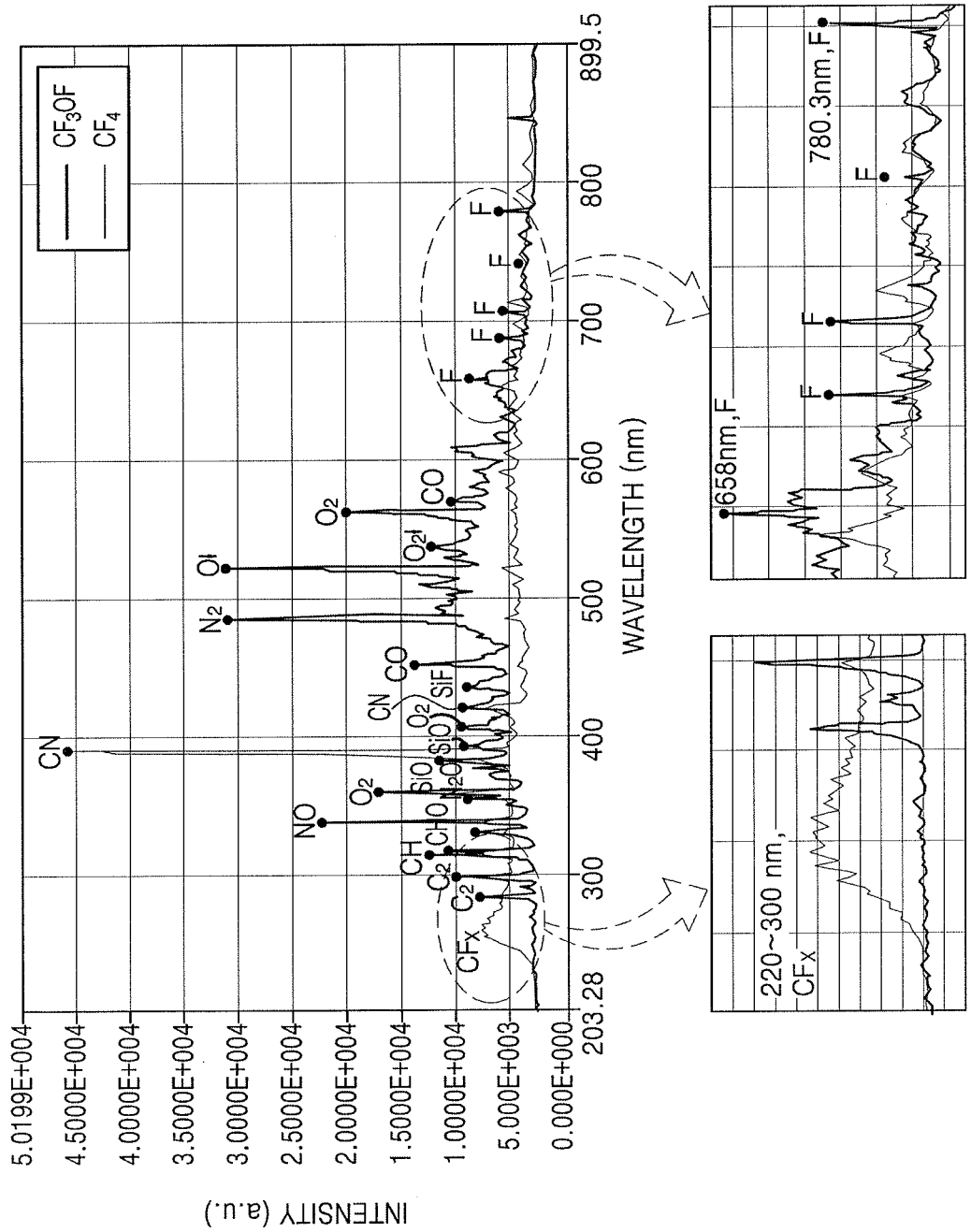
FIG. 11 illustrates a graph showing a result obtained by evaluating a gas dissociation characteristic by using optical emission spectroscopy (OES) in each of a case where a $CF_3OF$ gas is used as an etching gas and a case where a $CF_4$ gas is used as an etching gas, in plasma-etching a $Si_3N_4$ layer.

FIG. 11 illustrates a graph showing a result obtained by evaluating a gas dissociation characteristic by using OES in a case where a $Si_3N_4$ layer is plasma-etched by using a $CF_3OF$ gas as an etching gas according to Evaluation Example 1 and a case where the $Si_3N_4$ layer is plasma-etched by using a $CF_4$ gas as an etching gas according to the Comparative Example.

Figure 12:
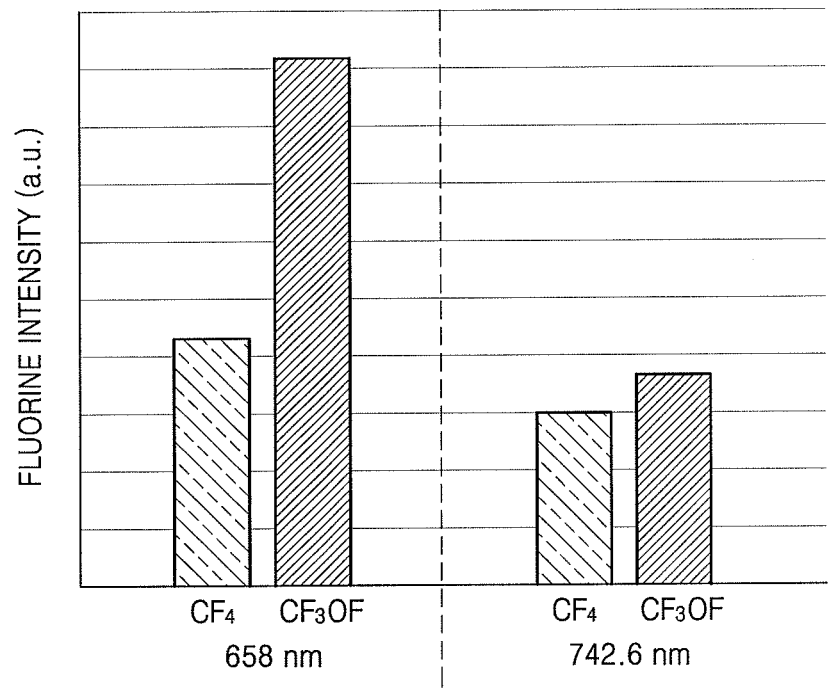
FIG. 12 illustrates a graph showing a result obtained by comparing maximum intensities of fluorine generated in an etching process in a case where a $CF_3OF$ gas is used as an etching gas and a case where a $CF_4$ gas is used as an etching gas, in plasma-etching a $Si_3N_4$ layer.

FIG. 12 illustrates a graph showing a result obtained by comparing maximum intensities of fluorine generated in an etching process in a case where a $Si_3N_4$ layer is plasma-etched by using a $CF_3OF$ gas as an etching gas according to Evaluation Example 1 and a case where the $Si_3N_4$ layer is plasma-etched by using a $CF_4$ gas as an etching gas according to the Comparative Example.

As seen in FIG. 12, the amount of generated fluorine free radicals when the $CF_3OF$ gas is used is higher than the amount of generated fluorine free radicals when the $CF_4$ gas is used, in a wavelength of 658 nm and 742.6 nm where fluorine free radicals are generated in FIG. 11.

Based on a result of FIG. 11 and a result of FIG. 12, it may be seen that $CF_4$ is difficult to autonomously generate a fluorine free radical, but since $CF_3OF$ enables a fluorine free radical to be actively generated and thus provides a good etch rate.

Evaluation Example 2

Evaluations were performed except that an etch target layer uses a $SiO_2$ layer instead of a $Si_3N_4$ layer, an etch characteristic of $CF_3OF$ was evaluated in the same method as that of Evaluation Example 1. As a Comparative Example, a result obtained by plasma-etching the $SiO_2$ layer with a $CF_4$ gas was compared with Evaluation Example 2.

Figure 13:
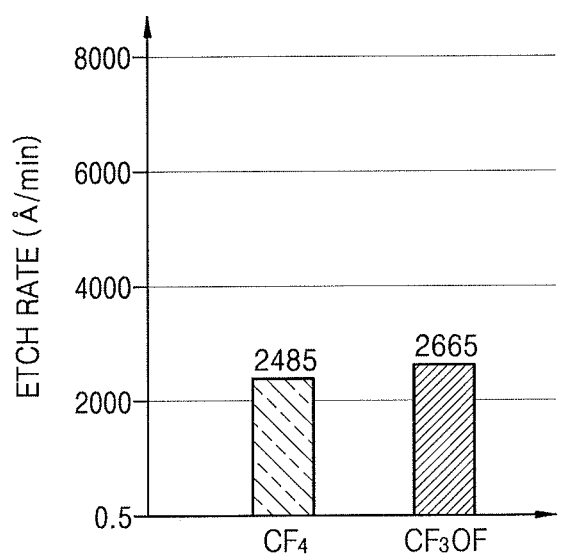
FIG. 13 illustrates a graph showing a result obtained by evaluating an etch rate in each of a case where a $CF_3OF$ gas is used as an etching gas and a case where a $CF_4$ gas is used as an etching gas, in plasma-etching a $SiO_2$ layer.

FIG. 13 illustrates a graph showing a result obtained by evaluating an etch rate in each of a case where a $CF_3OF$ gas is used as an etching gas according to Evaluation Example 2 and a case where a $CF_4$ gas is used as an etching gas according to the Comparative Example, in plasma-etching a $SiO_2$ layer.

Based on a result of FIG. 13, it may be seen that an etch rate of the $SiO_2$ layer was higher in a case of using the $CF_3OF$ gas than a case of using the $CF_4$ gas.

Figure 14:
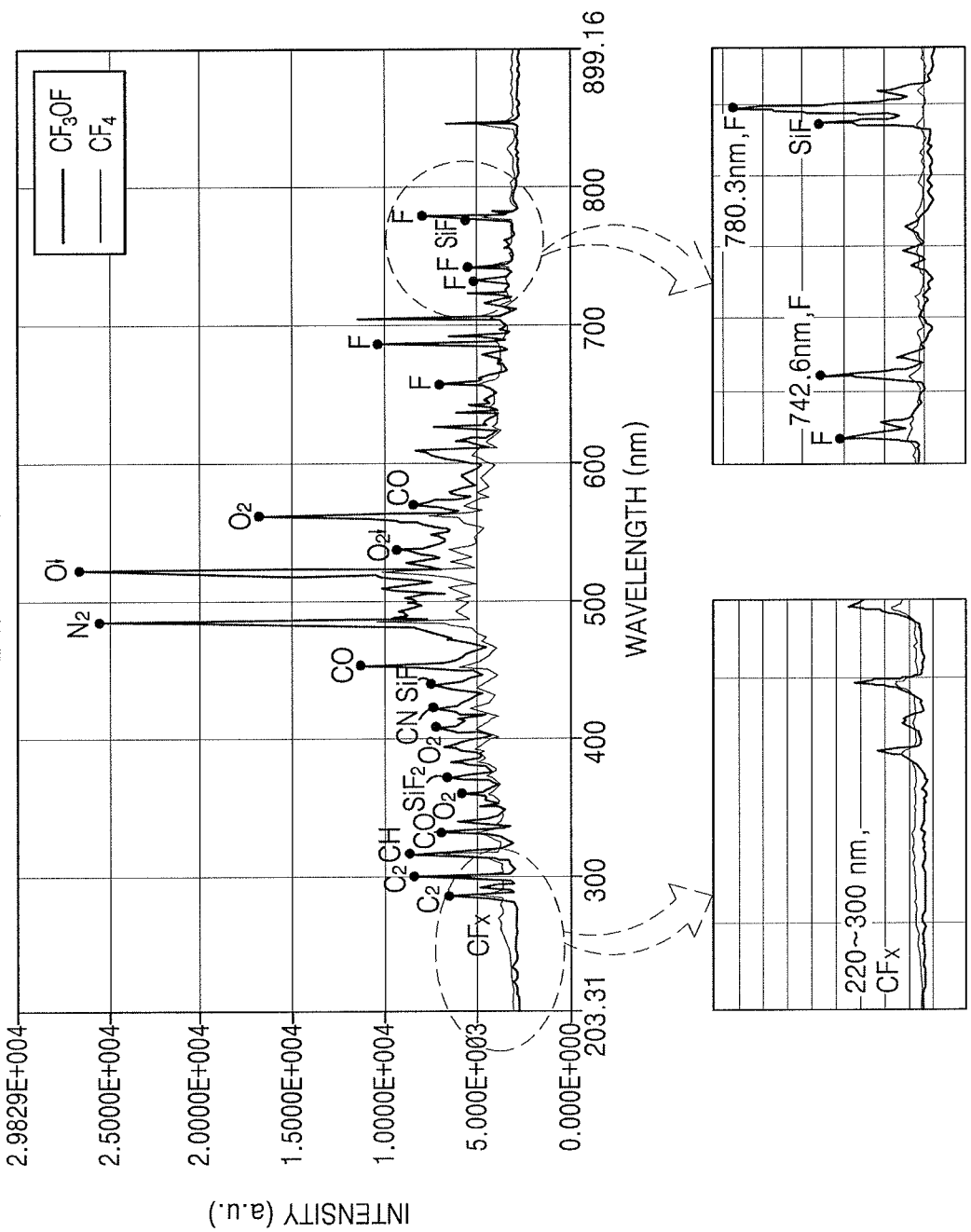
FIG. 14 illustrates a graph showing a result obtained by evaluating a gas dissociation characteristic by using OES in each of a case where a $CF_3OF$ gas is used as an etching gas and a case where a $CF_4$ gas is used as an etching gas, in plasma-etching a $SiO_2$ layer.

FIG. 14 illustrates a graph showing a result obtained by evaluating a gas dissociation characteristic by using OES in a case where a $SiO_2$ layer is plasma-etched by using a $CF_3OF$ gas as an etching gas according to Evaluation Example 2 and a case where the $SiO_2$ layer is plasma-etched by using a $CF_4$ gas as an etching gas according to the Comparative Example.

Figure 15:
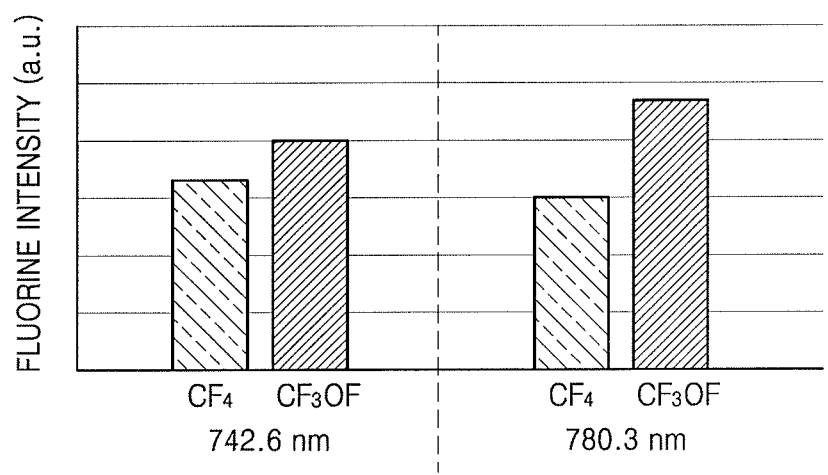
FIG. 15 illustrates a graph showing a result obtained by comparing maximum intensities of fluorine generated in an etching process in a case where a $CF_3OF$ gas is used as an etching gas and a case where a $CF_4$ gas is used as an etching gas, in plasma-etching a $SiO_2$ layer.

FIG. 15 illustrates a graph showing a result obtained by comparing maximum intensities of fluorine generated in an etching process in a case where a $SiO_2$ layer is plasma-etched by using a $CF_3OF$ gas as an etching gas according to Evaluation Example 2 and a case where the $SiO_2$ layer is plasma-etched by using a $CF_4$ gas as an etching gas according to the Comparative Example.

As seen in FIG. 15, the amount of generated fluorine free radicals when the $CF_3OF$ gas is used was higher than the amount of generated fluorine free radicals when the $CF_4$ gas is used, in a wavelength of 742.6 nm and 780.3 nm where fluorine free radicals are generated in FIG. 14.

Based on a result of FIG. 14 and a result of FIG. 15, it may be seen that in etching the $SiO_2$ layer with the $CF_3OF$ gas, an etch rate which is similar to or higher than a case where the $CF_4$ gas is used was provided even without a separate additive gas such as an $O_2$ gas.

Evaluation Example 3

The following evaluation was performed for evaluating a roughness characteristic and an etch selectivity characteristic when a $Si_3N_4$ layer is etched by using the etching gas mixture according to an embodiment.

First, a $Si_3N_4$ layer was formed on a substrate, and a photoresist pattern having a line and space pattern form was formed on the $Si_3N_4$ layer. A height of each of a plurality of photoresist line patterns configuring the photoresist pattern was 348.6 nm, and a width between adjacent photoresist line patterns of the plurality of photoresist line patterns was 167.0 nm. Subsequently, a $Si_3N_4$ pattern including a plurality of line patterns was obtained by plasma-etching the $Si_3N_4$ layer by using the photoresist pattern as an etch mask. In this case, in order to perform the plasma-etching, the MERIE device illustrated in FIG. 3 was used, and a mixture of $CF_3OF$ and $CF_8S$ was used as an etching gas mixture. Also, while the $Si_3N_4$ layer being plasma-etched, pressure of 100 mTorr and a source power of 300 W were applied to a reaction chamber of the MERIE device, and $CF_3OF$ of 20 sccm and $CF_8S$ of 30 sccm were supplied for thirty seconds. The $Si_3N_4$ pattern was obtained as a result of an etching process using the etching gas mixture, and then, a height of a photoresist pattern remaining on the $Si_3N_4$ pattern was 260.7 nm. After the photoresist pattern remaining on the $Si_3N_4$ pattern was removed through an ashing process and a strip process, a height of a $Si_3N_4$ pattern remaining on the substrate was 143.7 nm, and a width between adjacent line patterns of a plurality of line patterns configuring the $Si_3N_4$ pattern was 198.4 nm. Also, in a result obtained by measuring a surface roughness with atomic force microscopy (AFM), a roughness of a surface of a photoresist pattern before etching the $Si_3N_4$ layer was about 7.24 nm, a roughness of a surface of a photoresist pattern remaining on a $Si_3N_4$ pattern after the $Si_3N_4$ pattern is formed was about 9.527 nm, and a roughness of a surface of a $Si_3N_4$ pattern exposed after a photoresist layer is removed was about 1.382 nm.

Comparative Example 1

As a Comparative Example 1, evaluation was performed under the same condition as Evaluation Example 3, except that a comparative etching gas mixture including a mixture of $CF_4$, $CHF_3$, and $O_2$ was used. As a result, after a $Si_3N_4$ pattern is obtained as a result of an etching process using the comparative etching gas mixture, a height of a photoresist pattern remaining on the $Si_3N_4$ pattern was 246.1 nm, and after the photoresist pattern remaining on the $Si_3N_4$ pattern is removed through an ashing process and a strip process, a height of a $Si_3N_4$ pattern remaining on the substrate was 140.6 nm, and a width between adjacent line patterns of a plurality of line patterns configuring the $Si_3N_4$ pattern was 196.3 nm. Also, in a result obtained by measuring a surface roughness with AFM in a case of using the comparative etching gas mixture, a roughness of a surface of a photoresist pattern before etching a $Si_3N_4$ layer was about 7.24 nm, a roughness of a surface of a photoresist pattern remaining on a $Si_3N_4$ pattern after the $Si_3N_4$ pattern is formed was about 10.41 nm, and a roughness of a surface of a $Si_3N_4$ pattern exposed after a photoresist layer is removed was about 1.608 nm.

Based on a result of Evaluation Example 3 and a result of Comparative Example 1, it may be seen that in Evaluation Example 3 using the etching gas mixture according to an embodiment, a roughness of a photoresist pattern used as an etch mask is improved by about 9.2% and a roughness of a $Si_3N_4$ pattern is improved by about 16.5% in comparison with Comparative Example 1.

In Evaluation Example 3 and Comparative Example 1, in comparing heights of photoresist patterns respectively remaining on $Si_3N_4$ patterns after the $Si_3N_4$ patterns are formed, it may be seen that in etching a $Si_3N_4$ pattern by using a photoresist pattern as an etch mask, an etch selectivity when the etching gas mixture according to an embodiment is used was improved by about 18.9% in comparison with an etch selectivity of when the comparative etching gas mixture is used.

In Evaluation Example 3 and Comparative Example 1, based on a result obtained by evaluating LERs of a plurality of line patterns configuring a $Si_3N_4$ pattern by using a scanning electron microscope (SEM) after the $Si_3N_4$ pattern is formed, it may be seen that an LER when the etching gas mixture according to an embodiment is used was about 5.26 nm, an LER when the comparative etching gas mixture is used was about 5.88 nm, and an LER when the etching gas mixture according to an embodiment is used was improved by about 11.7% in comparison with an LER of when the comparative etching gas mixture is used.

Evaluation Example 4

In a result obtained by performing the same process as Evaluation Example 3 and Comparative Example 1 except that a $SiO_2$ layer instead of a $Si_3N_4$ layer was used as an etch target layer and a $SiO_2$ pattern was formed by etching the $SiO_2$ layer by using a photoresist pattern as an etch mask, a roughness of the $SiO_2$ pattern when the etching gas mixture according to an embodiment is used was about 2.375 nm, and a roughness of the $SiO_2$ pattern when the comparative etching gas mixture is used is about 3.068 nm. Based on such a result, it may be seen that a roughness of the $SiO_2$ pattern when the etching gas mixture according to an embodiment was used was improved by about 12.1% in comparison with a roughness of the $SiO_2$ pattern when the comparative etching gas mixture was used.

Evaluation Example 5

Figure 16:
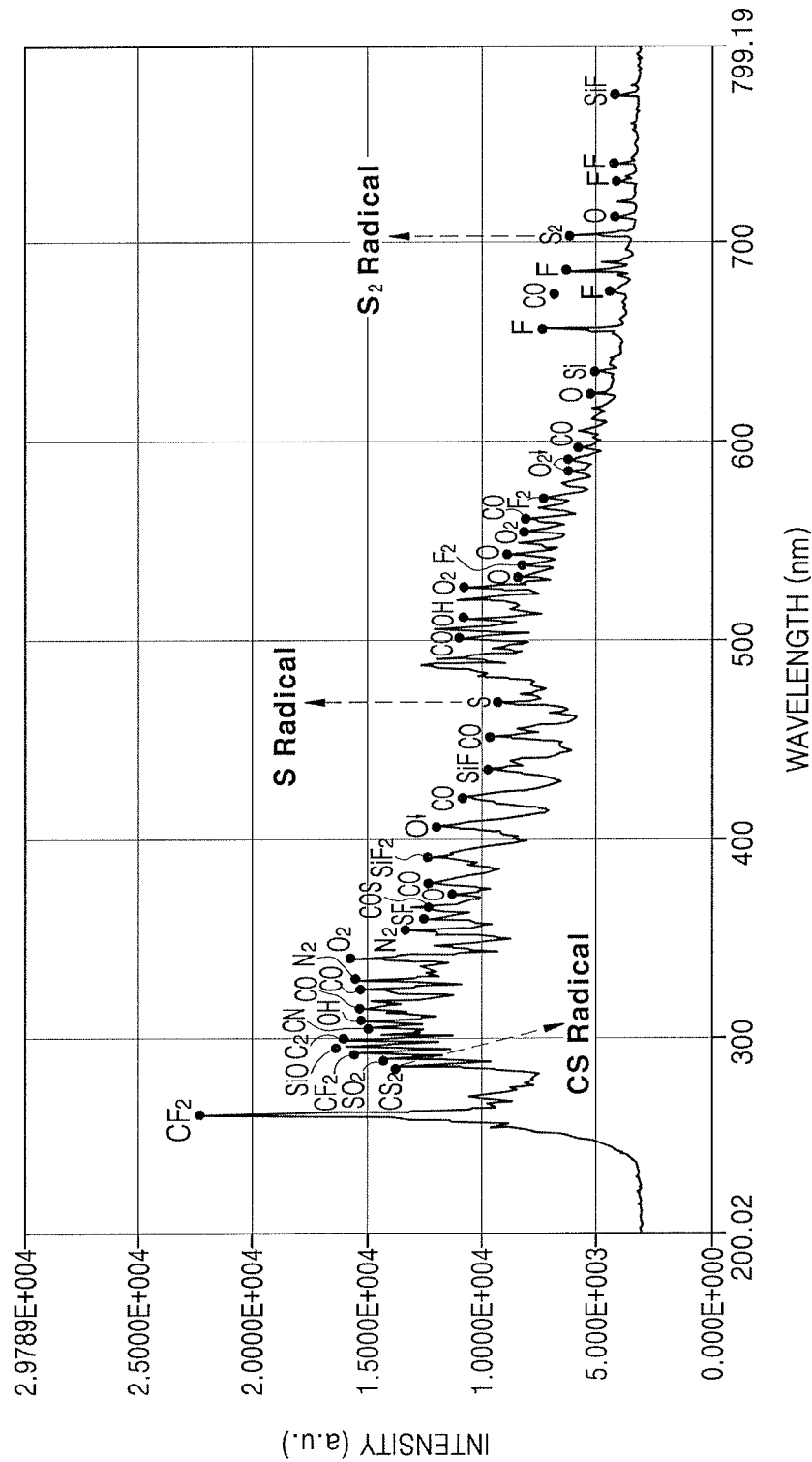
FIG. 16 illustrates a graph showing a result obtained by evaluating a gas dissociation characteristic by using OES when an etching process is performed on a $Si_3N_4$ layer by using an etching gas mixture according to an embodiment.

FIG. 16 illustrates a graph showing a result obtained by evaluating a gas dissociation characteristic by using OES when an etching process is performed on a $Si_3N_4$ layer by using a mixture of $CF_3OF$ and $CF_8S$ as an etching gas mixture according to Evaluation Example 5.

Based on a result of FIG. 16, it may be seen that when etching the $Si_3N_4$ layer by using the mixture of $CF_3OF$ and $CF_8S$, a S radical, a $S_2$ radical, and a CS radical were generated. The radicals may be adsorbed onto a surface of a photoresist pattern which is used as an etch mask in a process of etching the $Si_3N_4$ layer, and particularly, by using the CS radical which is a non-volatile radical, a S-containing passivation layer is formed on the surface of the photoresist pattern to protect the photoresist pattern, thereby preventing a deformation of the photoresist pattern. Accordingly, the photoresist pattern and the S-containing passivation layer act as an etch mask, and thus, an etch selectivity of the $Si_3N_4$ layer is improved and an LER of a $Si_3N_4$ pattern was improved.

Figure 17:
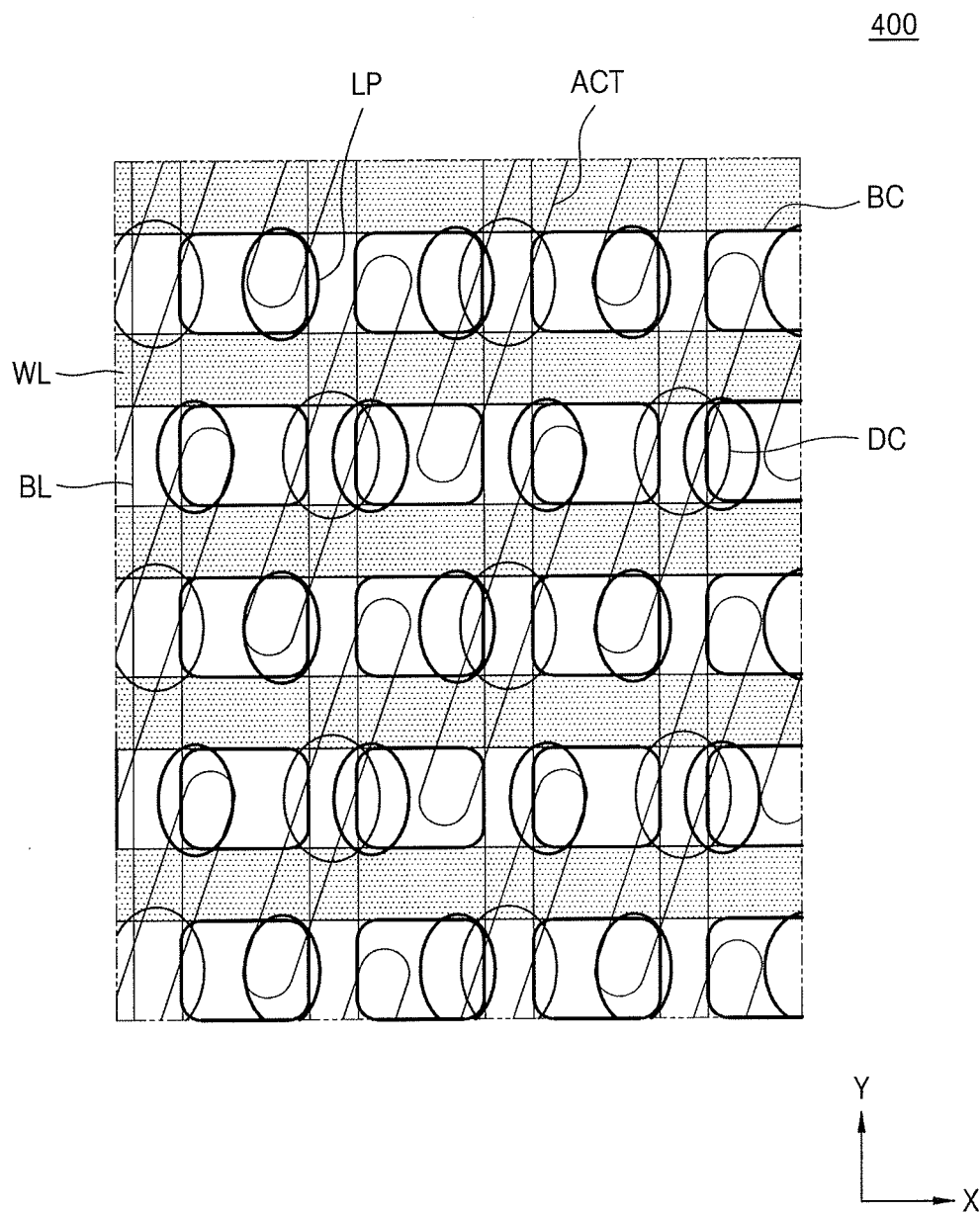
FIG. 17 illustrates a plan layout of an exemplary IC device manufactured by a method according to embodiments.

FIG. 17 illustrates a plan layout of an exemplary IC device 400 manufactured by a method according to embodiments. In FIG. 17, main elements of a memory cell array area of a DRAM device are illustrated.

Referring to FIG. 17, the IC device 400 may include a plurality of active areas ACT which are arranged to horizontally extend in a diagonal direction with respect to an X direction and a Y direction of a plane. A plurality of word lines WL may extend in parallel in the X direction across the plurality of active areas ACT. A plurality of bit lines BL may extend in parallel in the Y direction intersecting the X direction, on the plurality of word lines WL. The plurality of bit lines BL may be connected to the plurality of active areas ACT through a direct contact DC.

A plurality of buried contacts BC may be provided between two adjacent bit lines BL of the plurality of bit lines BL. A plurality of conductive landing pads LP may be provided on the plurality of buried contacts BC. The plurality of buried contacts BC and the plurality of conductive landing pads LP may connect bottom electrodes of capacitors, provided on the plurality of bit lines BL, to the active areas ACT. Each of the plurality of conductive landing pads LP may be disposed in order for at least a portion thereof to overlap a corresponding buried contact BC.

FIGS. 18A to 18H illustrate cross-sectional views of stages in a method of manufacturing the IC device 400 illustrated in FIG. 17 by using the method of forming a pattern and the method of manufacturing an IC device described above with reference to FIGS. 1 to 9B. In FIGS. 18A to 18H, like reference numerals in FIGS. 1 to 9B refer to like elements, and their repetitive descriptions may be omitted.

Figure 18A:
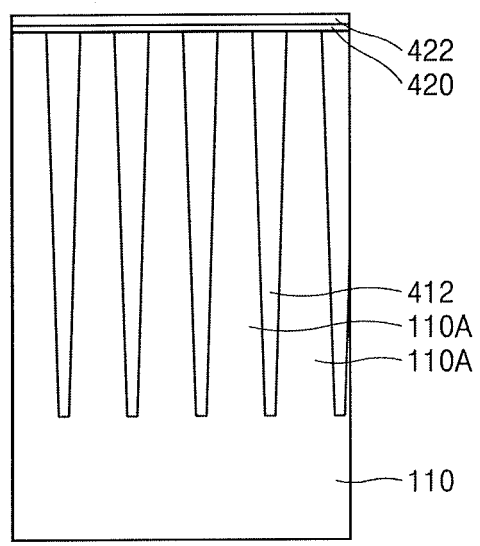
FIGS. 18A to 18H illustrate cross-sectional views of stages in a method of manufacturing an IC device, according to embodiments.

Referring to FIG. 18A, an isolation layer 412 may be formed on a substrate 110 to define a plurality of active areas 110A.

The plurality of active areas 110A may each have a relatively long island planar shape having a short axis and a long axis like the active areas ACT illustrated in FIG. 17. In order to define the plurality of active areas ACT, a substrate 110 may be etched by using a thin layer pattern, which is formed in the method of forming a pattern described above with reference to FIGS. 1 to 2E, as an etch mask.

In an implementation, the isolation layer 412 may include, e.g., an oxide, a nitride, or a combination thereof. The isolation layer 412 may be formed of a single layer including one kind of insulation layer or a multilayer including a combination of at least three kinds of insulation layers.

A plurality of word line trenches having a plurality of linear shapes extending in parallel may be formed on the substrate 110. In order to form the plurality of word line trenches, the substrate 110 and the isolation layer 412 may be etched by using a thin layer pattern, which is formed in the method of forming a pattern described above with reference to FIGS. 1 to 2E, as an etch mask.

The plurality of word line trenches may extend in parallel in the X direction of FIG. 17 and may each have a line shape crossing the plurality of active areas 110A. A plurality of gate dielectric layers, a plurality of word lines WL (see FIG.

17), and a plurality of buried insulation layers may be sequentially formed inside the plurality of word line trenches.

In an implementation, after the word lines WL are formed, a source/drain area may be formed on a top of each of the plurality of active areas 110A by injecting impurity ions into the substrate 110 from both sides of each of the word lines WL. In an implementation, an impurity ion injecting process for forming the source/drain area may be performed before forming the plurality of word lines WL.

A first insulation layer 420 and a second insulation layer 422 may be sequentially formed on the substrate 110. In an implementation, the first insulation layer 420 may include oxide, and the second insulation layer 422 may include nitride.

Figure 18B:
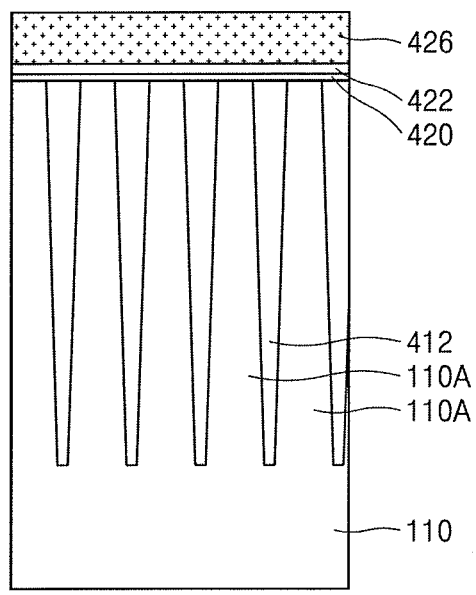

Referring to FIG. 18B, a first conductive layer 426 may be formed on the substrate 110. The first conductive layer 426 may include doped polysilicon.

Figure 18C:
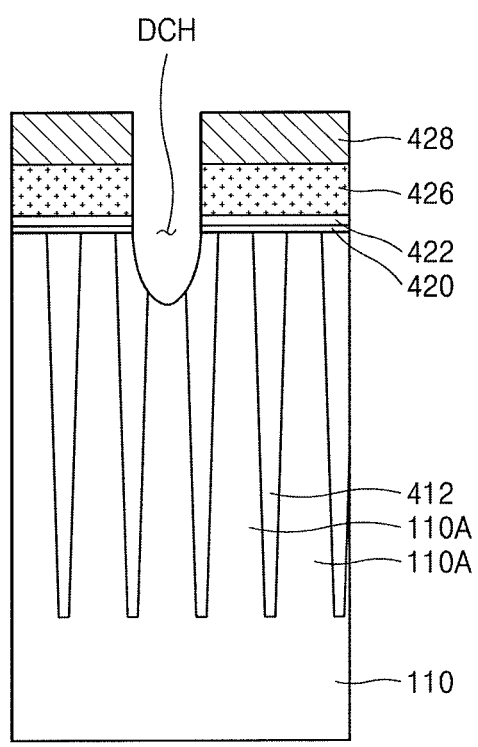

Referring to FIG. 18C, a hardmask pattern 428 may be formed on the first conductive layer 426, and then, the first conductive layer 426 may be etched by using the hardmask pattern 428 as an etch mask. Therefore, a portion of the substrate 110 and a portion of the isolation layer 412 may be exposed by the etching, and a direct contact hole DCH exposing each of the active areas ACT of the substrate 110 may be formed by etching the exposed portion of the substrate 110 and the exposed portion of the isolation layer 412. The etch mask pattern, which is formed in the method of forming a pattern according to embodiments described above with reference to FIGS. 1 to 2E, may be used for forming the hardmask pattern 428.

Figure 18D:
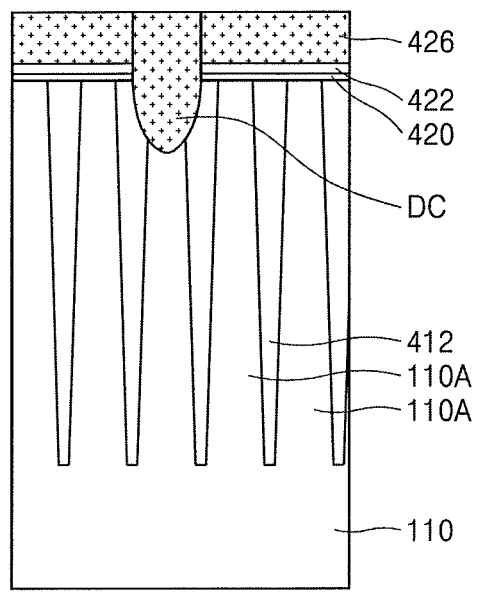

Referring to FIG. 18D, the hardmask pattern 428 (see FIG. 18C) may be removed, and then, a second conductive layer having a thickness sufficient to fill the direct contact hole DCH may be formed inside the direct contact hole DCH (see FIG. 18C) and on the first conductive layer 426. A direct contact DC including the second conductive layer remaining inside the direct contact hole DCH may be formed by etching back the second conductive layer in order for the second conductive layer to remain inside only the direct contact hole DCH. The direct contact DC may include doped polysilicon.

Figure 18E:
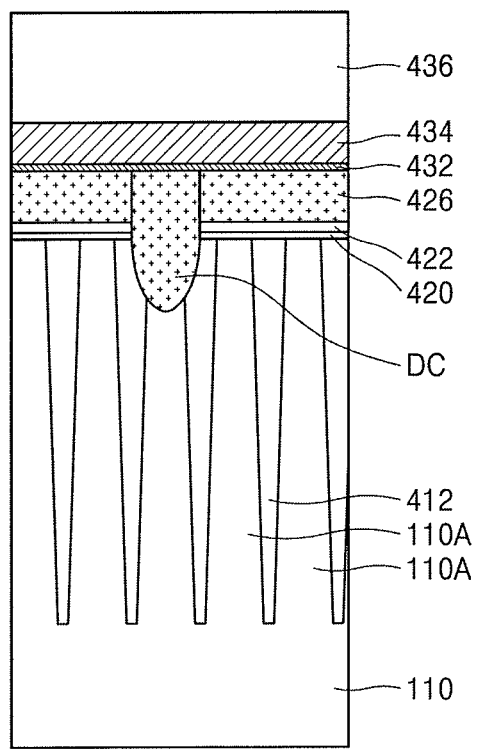

Referring to FIG. 18E, a third conductive layer 432, a fourth conductive layer 434, and an insulation capping layer 436 may be sequentially formed on the first conductive layer 426 and the direct contact DC.

In an implementation, the third conductive layer 432 and the fourth conductive layer 434 may each include, e.g., TiN, TiSiN, W, tungsten silicide, or a combination thereof. In an implementation, the third conductive layer 432 may include TiSiN, and the fourth conductive layer 434 may include W. In an implementation, the insulation capping layer 436 may include silicon nitride, e.g., may include a $Si_3N_4$ layer.

Figure 18F:
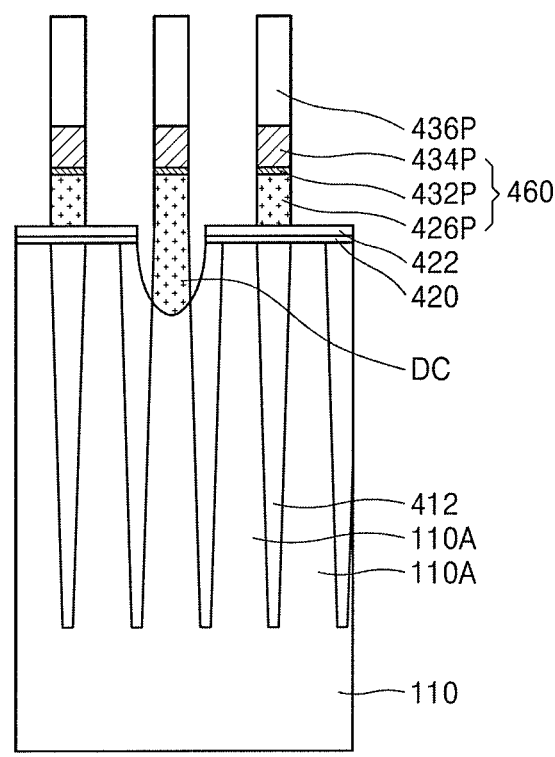

Referring to FIG. 18F, an insulation capping pattern 436P may be formed by patterning the insulation capping layer 436 through a photolithography process. In an implementation, a thin layer pattern which is formed in the method of forming a pattern according to embodiments described above with reference to FIGS. 1 to 2E may be used as an etch mask in order to form the insulation capping pattern 436P. In an implementation, in order to form the insulation capping pattern 436P, the insulation capping layer 436 may be etched by using a photoresist pattern as an etch mask. In this case, by using the etching gas mixture including perfluorinated alkyl hypofluorite and an organosulfur compound according to an embodiment, the insulation capping layer 436 may be etched in the method of forming a pattern according to embodiments described above with reference to FIGS. 1 to 2E. As a result, the insulation capping pattern 436P with improved LER characteristic may be formed.

Subsequently, a plurality of bit lines 460 may be formed by etching a portion of a lower structure by using the insulation capping layer 436P as an etch mask. In order to form the plurality of bit lines 460, a portion of each of the fourth conductive layer 434, the third conductive layer 432, the first conductive layer 426, and the direct contact DC may be sequentially etched by using the insulation capping pattern 436P as an etch mask, thereby forming the plurality of bit lines 460 including a first conductive pattern 426P, a third conductive pattern 432P, and a fourth conductive pattern 434P. The plurality of bit lines 460 may be connected to the active areas 110A of the substrate 110 through the direct contact DC.

In forming the plurality of bit lines 460, the insulation capping pattern 436P of which an LER characteristic may be improved by performing an etching process using the etching gas mixture according to an embodiment is used as an etch mask, a good side wall profile of the insulation capping pattern 436P may be transferred to the plurality of bit lines 460, and a plurality of line-shaped bit lines 460 with improved LER characteristic may be obtained.

Figure 18G:
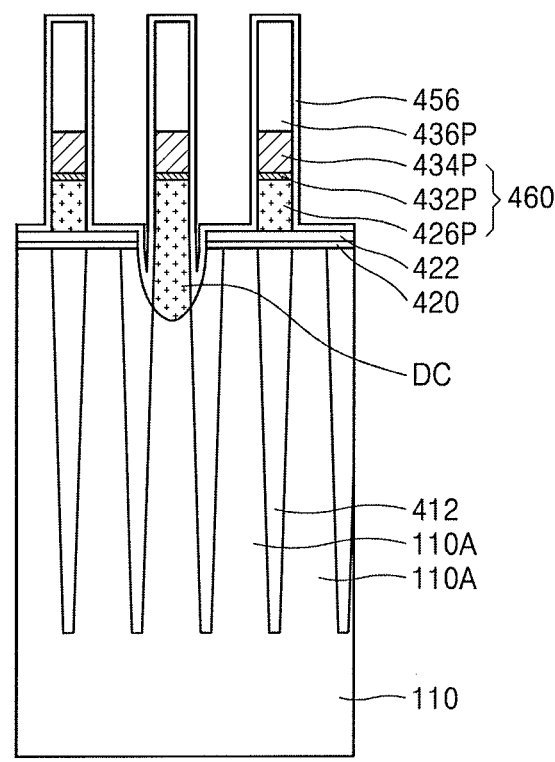

Referring to FIG. 18G, an insulation liner 456 may be formed on an exposed top of a resultant material where the plurality of bit lines 460 are formed. The insulation liner 456 may include nitride.

Figure 18H:
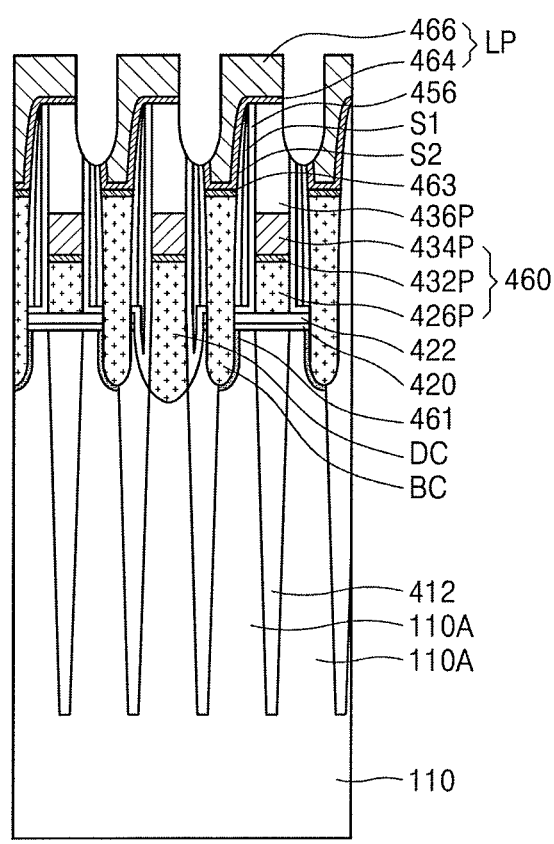

Referring to FIG. 18H, a plurality of buried contacts BC and a plurality of conductive landing pads LP connected to the plurality of buried contacts BC may be formed in a space between adjacent bit lines of the plurality of bit lines 460 in the resultant material of FIG. 18G.

To provide a more detailed description, a plurality of insulation spacers S1 and S2 covering the insulation liner 456 may be formed on a side wall of each of the plurality of bit lines 460, and a plurality of insulation patterns which may limit a plurality of holes for forming the buried contacts BC between a space between adjacent bit lines of the plurality of bit lines 460 may be formed. Subsequently, the active areas 110A of the substrate 110 may be exposed through the plurality of holes, and a metal silicide layer 461 may be formed on a surface of each of the exposed active areas 110A. Subsequently, the plurality of buried contacts BC respectively connected to the active areas 110A may be formed by filling a conductive layer into a lower portion of the inside of each of the plurality of holes.

In an implementation, the insulation spaces S1 and S2 may each include silicon oxide, silicon nitride, air, or a combination thereof. In an implementation, the insulation spacers S1 and S2 may be formed of a double layer. In an implementation, the insulation spacers S1 and S2 may be formed of a single layer or a triple layer. The plurality of insulation patterns may each include nitride, oxide, or a combination thereof.

In an implementation, the metal silicide layer 461 may include cobalt silicide. In an implementation, the plurality of buried contacts BC may each include doped polysilicon. In an implementation, the metal silicide layer 461 may be omitted.

Subsequently, a metal silicide layer 463 may be formed on the plurality of buried contacts BC in the plurality of holes between the plurality of bit lines 460. In an implementation, the metal silicide layer 463 may include cobalt silicide.

Subsequently, a conductive layer 466 and a conductive barrier layer 464 filling the insides of the plurality of holes and covering tops of the plurality of bit lines 460 may be formed on the metal silicide layer 463. In an implementation, the conductive barrier layer 464 may be formed in a Ti/TiN stacked structure. In an implementation, the conductive layer 466 may include doped polysilicon, metal, metal silicide, conductive metal nitride, or a combination thereof.

Subsequently, in a cell array area, a mask pattern exposing a portion of the conductive layer 466 may be formed on the conductive layer 466, and then, a portion of the conductive barrier layer 464, a portion of the conductive layer 466, and a portion of each of peripheral insulation layers thereof may be etched by using the mask pattern as an etch mask, thereby forming a plurality of conductive landing pads LP including left portions of the conductive barrier layer 464 and the conductive layer 466. The plurality of landing pads LP may have the forms of a plurality of island-shaped patterns spaced apart from each other as illustrated in FIG. 17. In order to form the plurality of conductive landing pads LP, an etching process may be performed by using a thin layer pattern, which is formed in the method of forming a pattern described above with reference to FIGS. 1 to 2E, as an etch mask.

Subsequently, a plurality of capacitor bottom electrodes electrically connectable to the plurality of conductive landing pads LP may be formed in the cell array area.

A process of manufacturing a DRAM device by using a method of manufacturing an IC device according to an embodiment has been described above with reference to FIGS. 17 to 18H for example. In an implementation, various IC devices such as an MRAM device, an SRAM device, a PRAM device, an RRAM device, an FRAM device, a VNAND flash memory device, and a logic device may be manufactured by using the method of manufacturing an IC device according to an embodiment.

As described above, the etching gas mixture according to the embodiments may provide a good etch rate when etching a silicon-containing thin layer, the etching gas mixture may have a low GWP index, and the etching gas mixture may hardly have an adverse effect on global warming.

In the method of forming a pattern according to the embodiments, when etching a thin layer by using the etching gas mixture, non-volatile radicals which are etch by-products may be adsorbed onto an exposed surface of an etch mask pattern, and thus, a sulfur-containing passivation layer covering the etch mask pattern may be formed, whereby the sulfur-containing passivation layer may act as an etch mask along with the etch mask pattern. Accordingly, while an etching process is being performed on the thin layer, an etch selectivity of the thin layer is enhanced by the sulfur-containing passivation layer.

In the method of manufacturing an IC device according to the embodiments, a good etch rate may be provided by using a method of forming an eco-friendly pattern, and a line edge roughness of a pattern to form is improved. Accordingly, a precision of a dimension of the pattern to form may be precisely controlled, and the reliability of an IC device is enhanced.

By way of summation and review, in performing a dry etching process for forming a fine pattern for implementing an IC device, technology for implementing a dry etching process using materials having a low global warming potential (GWP) index may be used so as to replace conventional etching materials having a high GWP index, in addition to providing a good etch rate.

The embodiments may provide an etching gas mixture for forming an eco-friendly fine pattern.

The embodiments may provide an etching gas mixture, a method of forming a pattern by using the etching gas mixture, and a method of manufacturing an IC device by using the etching gas mixture, which enable an eco-friendly fine pattern to be formed, provide a good etch rate, and improve a line edge roughness of a pattern to form.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An etching gas mixture, comprising:
   a C1-C3 perfluorinated alkyl hypofluorite; and
   a C1-C10 organosulfur compound that includes a C—S bond,
   wherein the C1-C10 organosulfur compound that includes a C—S bond includes CFS, $CF_2S$, $CF_3S$, $C_2F_4S_2$ (CAS No. 371-73-3), $C_2F_4S_2$ (CAS No. 1717-50-6), $C_2F_6S$, $C_2F_6S_2$, $C_2F_6S_3$, $C_2F_6S_4$, $C_2F_8S$ (CAS No. 30341-38-9), $C_2F_8S$ (CAS No. 1186-51-2), $C_2F_{10}S$ (CAS No. 42179-02-2), $C_2F_{10}S$ (CAS No. 354-67-6), $C_3F_6S_3$, $C_4F_{16}S_2$, $C_4F_6S$ (CAS No. 7445-60-5), $C_4F_6S$ (CAS No. 380-40-5), $C_4F_6S_2$, $C_4F_8S$ (CAS No. 706-76-3), $C_4F_8S$ (CAS No. 2261-43-0), or $C_6F_{16}S$.

2. The etching gas mixture as claimed in claim 1, wherein the $C_1$-$C_3$ perfluorinated alkyl hypofluorite includes trifluoromethyl hypofluorite ($CF_3OF$).

3. The etching gas mixture as claimed in claim 1, wherein the etching gas mixture includes:
   10 vol % to 99 vol % of the C1-C3 perfluorinated alkyl hypofluorite, and
   1 vol % to 90 vol % of the C1-C10 organosulfur compound, all vol % being based on a total volume of the etching gas mixture.

4. The etching gas mixture as claimed in claim 1, further comprising an inert gas.

5. The etching gas mixture as claimed in claim 4, wherein the etching gas mixture includes:
   10 vol % to 99 vol % of the C1-C3 perfluorinated alkyl hypofluorite,
   0.1 vol % to 90 vol % of the C1-C10 organosulfur compound, and
   0.0001 vol % to 10 vol % of the inert gas, all vol % being based on a total volume of the etching gas mixture.

6. A method of forming a pattern, the method comprising etching a thin layer using the etching gas mixture as claimed in claim 1.

7. The method as claimed in claim 6, wherein the thin layer includes a silicon-containing layer.

8. The method as claimed in claim 6, wherein, in the etching gas mixture:
   the C1-C3 perfluorinated alkyl hypofluorite includes $CF_3OF$.

9. The method as claimed in claim 6, wherein:
   the etching gas mixture further includes an inert gas, and
   the C1-C3 perfluorinated alkyl hypofluorite includes $CF_3OF$.

10. A method of forming a pattern, the method comprising:

forming an etch mask pattern on a thin layer such that the etch mask pattern includes an opening;

forming a sulfur-containing passivation layer that covers the etch mask pattern by etching a portion of the thin layer through the opening by using plasma obtained from the etching gas mixture as claimed in claim 1; and forming a thin layer pattern by further etching the thin layer through the opening by using the etch mask pattern and the sulfur-containing passivation layer as an etch mask and by using the plasma obtained from the etching gas mixture.

11. The method as claimed in claim 10, wherein, in the etching gas mixture:

the C1-C3 perfluorinated alkyl hypofluorite includes $CF_3OF$.

12. The method as claimed in claim 10, wherein forming the sulfur-containing passivation layer and forming the thin layer pattern are performed in-situ in one reaction chamber.

13. The method as claimed in claim 10, wherein the sulfur-containing passivation layer includes an organic polymer including a C—S bond.

14. A method of manufacturing an integrated circuit device, the method comprising:

forming a structure on a substrate such that the structure includes a silicon-containing thin layer;

forming a photoresist pattern on the structure such that the photoresist pattern includes a plurality of openings;

forming a sulfur-containing passivation layer covering the photoresist pattern by etching a portion of the silicon-containing thin layer through the plurality of openings by using plasma obtained from the etching gas mixture as claimed in claim 1; and forming a thin layer pattern by further etching the silicon-containing thin layer through the plurality of openings by using the photoresist pattern and the sulfur-containing passivation layer as an etch mask and by using the plasma obtained from the etching gas mixture.

15. The method as claimed in claim 14, wherein:

the photoresist pattern includes a plurality of photoresist line patterns that extend in parallel, and the thin layer pattern includes a plurality of line patterns.

16. The method as claimed in claim 14, wherein:

the C1-C3 perfluorinated alkyl hypofluorite includes $CF_3OF$, and the etching gas mixture includes:

10 vol % to 99 vol % of the $CF_3OF$, and 1 vol % to 90 vol % of the C1-C10 organosulfur compound, all vol % being based on a total volume of the etching gas mixture.

17. The method as claimed in claim 14, wherein:

the C1-C3 perfluorinated alkyl hypofluorite includes $CF_3OF$, the etching gas mixture further includes an inert gas, and the etching gas mixture includes:

10 vol % to 99 vol % of the $CF_3OF$, 0.1 vol % to 90 vol % of the C1-C10 organosulfur compound, and 0.0001 vol % to 10 vol % of the inert gas, all vol % being based on a total volume of the etching gas mixture.

\* \* \* \* \*